(12) United States Patent
Kim et al.

(10) Patent No.: US 10,355,046 B1
(45) Date of Patent: Jul. 16, 2019

(54) STEEP SLOPE FIELD-EFFECT TRANSISTOR (FET) FOR A PERPENDICULAR MAGNETIC TUNNEL JUNCTION (PMTJ)

(71) Applicant: Spin Memory, Inc., Fremont, CA (US)

(72) Inventors: Kuk-Hwan Kim, San Jose, CA (US); Dafna Beery, Palo Alto, CA (US); Amitay Levi, Cupertino, CA (US); Andrew J. Walker, Mountain View, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 15/859,139

(22) Filed: Dec. 29, 2017

(51) Int. Cl.
*G11C 11/16* (2006.01)
*H01L 27/22* (2006.01)
(Continued)

(52) U.S. Cl.
CPC .......... *H01L 27/228* (2013.01); *G11C 11/161* (2013.01); *G11C 11/1675* (2013.01);
(Continued)

(58) Field of Classification Search
CPC ... H01L 27/2454; H01L 29/7827–7828; H01L 29/66666; H01L 29/0676; H01L 29/66469; H01L 29/78642; H01L 29/42392; H01L 29/1037; H01L 21/823487; H01L 21/823885; H01L 27/228; H01L 43/02; H01L 43/08; H01L 43/10; H01L 43/12; H01L 29/66659; H01L 29/7835; H01L 29/78624; H01L 29/41775; H01L 29/864; H01L 29/66159;
(Continued)

(56) References Cited

U.S. PATENT DOCUMENTS 9,287,362 B1 * 3/2016 Basu ...................... H01L 29/152
9,385,195 B1 * 7/2016 Zhang ................. H01L 29/1033
(Continued)

OTHER PUBLICATIONS

Notice of Allowance from U.S. Appl. No. 15/855,953, dated Nov. 14, 2018.
(Continued)

*Primary Examiner* — Marc Anthony Armand
*Assistant Examiner* — Younes Boulghassoul
(74) *Attorney, Agent, or Firm* — Zilka-Kotab, P.C.

(57) ABSTRACT

According to one embodiment, an apparatus includes a bottom electrode layer positioned above a substrate in a film thickness direction, a source layer positioned above the bottom electrode layer in the film thickness direction, an impact ionization channel (i-channel) layer positioned above the source layer in the film thickness direction, a drain layer positioned above the i-channel layer in the film thickness direction, an upper electrode layer positioned above the drain layer in the film thickness direction that forms a stack that includes the bottom electrode layer, the source layer, the i-channel layer, the drain layer, and the upper electrode layer, and a gate layer positioned on sides of the i-channel layer along a plane perpendicular to the film thickness direction in an element width direction. The gate layer is positioned closer to the drain layer than the source layer. Other apparatuses are described in accordance with more embodiments.

19 Claims, 16 Drawing Sheets

(51) Int. Cl.

| | | |
|---|---|---|
| H01L 29/08 | (2006.01) | |
| H01L 29/66 | (2006.01) | |
| H01L 29/78 | (2006.01) | |
| H01L 43/02 | (2006.01) | |
| H01L 43/08 | (2006.01) | |
| H01L 43/10 | (2006.01) | |
| H01L 43/12 | (2006.01) | |
| H01L 29/165 | (2006.01) | |
| H01L 29/417 | (2006.01) | |
| H01L 29/772 | (2006.01) | |
| H01L 29/423 | (2006.01) | |
| H01L 29/45 | (2006.01) | |
| H01L 29/167 | (2006.01) | |
| H01L 29/10 | (2006.01) | |

(52) U.S. Cl.
CPC ...... *H01L 29/0847* (2013.01); *H01L 29/1037* (2013.01); *H01L 29/165* (2013.01); *H01L 29/167* (2013.01); *H01L 29/41775* (2013.01); *H01L 29/42356* (2013.01); *H01L 29/456* (2013.01); *H01L 29/66666* (2013.01); *H01L 29/7725* (2013.01); *H01L 29/7827* (2013.01); *H01L 43/02* (2013.01); *H01L 43/08* (2013.01); *H01L 43/12* (2013.01); *H01L 43/10* (2013.01)

(58) Field of Classification Search
CPC ............. H01L 29/7391; H01L 29/7725; H01L 29/868; H01L 2924/12031; H01L 29/66356; G11C 11/14–1697; G11C 2211/5615; H01F 10/329
See application file for complete search history.

(56) References Cited

U.S. PATENT DOCUMENTS

| | | | | |
|---|---|---|---|---|
| 9,613,955 | B1* | 4/2017 | Anderson | H01L 27/0886 |
| 10,243,021 | B1 | 3/2019 | Kim et al. | |
| 2006/0220086 | A1* | 10/2006 | Charbuillet | H01L 29/7391 257/296 |
| 2007/0267619 | A1* | 11/2007 | Nirschl | H01L 27/2436 257/3 |
| 2010/0327319 | A1* | 12/2010 | Iacopi | H01L 29/7391 257/192 |
| 2011/0253981 | A1* | 10/2011 | Rooyackers | B82Y 10/00 257/24 |
| 2012/0187376 | A1* | 7/2012 | Tomioka | B82Y 10/00 257/24 |
| 2013/0223124 | A1* | 8/2013 | Park | H01L 27/2436 365/96 |
| 2013/0264544 | A1* | 10/2013 | Karg | B82Y 10/00 257/24 |
| 2014/0291663 | A1 | 10/2014 | Kuo et al. | |
| 2014/0299831 | A1* | 10/2014 | Park | H01L 27/2454 257/4 |
| 2014/0353593 | A1* | 12/2014 | Smets | H01L 29/66666 257/39 |
| 2015/0243707 | A1* | 8/2015 | Park | H01L 27/2454 257/2 |
| 2016/0218211 | A1* | 7/2016 | Yuan | H01L 29/66356 |
| 2016/0268256 | A1* | 9/2016 | Yang | H01L 27/088 |
| 2016/0268401 | A1* | 9/2016 | Aleksov | H01L 29/7869 |
| 2016/0284536 | A1* | 9/2016 | Fukui | B82Y 10/00 |
| 2016/0284750 | A1 | 9/2016 | Ionescu et al. | |
| 2016/0293756 | A1* | 10/2016 | Liu | H01L 29/7827 |
| 2016/0300886 | A1* | 10/2016 | Oh | H01L 27/2454 |
| 2016/0336324 | A1* | 11/2016 | Li | H01L 27/0928 |
| 2017/0365712 | A1* | 12/2017 | Bu | H01L 29/7827 |
| 2018/0308960 | A1* | 10/2018 | Afzalian | H01L 29/7391 |

OTHER PUBLICATIONS

Nagavarapu et al., "The Tunnel Source (PNPN) n-MOSFET: A Novel High Performance Transistor," IEEE Transactions on Electron Devices, vol. 55, No. 4, Apr. 2008, pp. 1013-1019.
Singh et al., "A Novel Si-Tunnel FET based SRAM Design for Ultra Low-Power 0.3V VDD Applications," IEEE, 2010, pp. 181-186.
Khatami et al., "Steep Subthreshold Slope n- and p-Type Tunnel-FET Devices for Low-Power and Energy-Efficient Digital Circuits," IEEE Transactions on Electron Devices, vol. 56, No. 11, Nov. 2009, pp. 2752-2761.
Liu et al., "Steep Switching Tunnel FET: A Promise to Extend the Energy Efficient Roadmap for Post-CMOS Digital and Analog/RF Applications," Symposium on Low Power Electronics and Design, IEEE, 2013, pp. 145-150.
Born et al., "Tunnel FET: A CMOS Device for High Temperature Applications," Proceedings of the 25th International Conference on Microelectronics, IEEE, May 2006, pp. 1-4.
Ieong et al., "Comparison of Raised and Schottky Source/Drain MOSFETs Using a Novel Tunneling Contact Model," IEEE, 1998, pp. 733-736.
De Michielis et al., "Understanding the Superlinear Onset of Tunnel-FET Output Characteristic," IEEE Electron Device Letters, vol. 33, No. 11, Nov. 2012, pp. 1523-1525.
De Michielis et al., "Tunneling and Occupancy Probabilities: How Do They Affect Tunnel-FET Behavior?" IEEE Electron Device Letters, vol. 34, No. 6, Jun. 2013, pp. 726-728.
Wang et al., "A Novel Barrier Controlled Tunnel FET," IEEE Electron Device Letters, 2014, pp. 1-3.
Mookeerjea et al., "Temperature-Dependent I-V Characteristics of a Vertical In0.53Ga0.47As Tunnel FET," IEEE Electron Device Letters, vol. 31, No. 6, Jun. 2010, pp. 564-566.
Ahish et al., "Performance Enhancement of Novel InAs/Si Hetero Double-Gate Tunnel FET Using Gaussian Doping," IEEE Transactions on Electron Devices, 2015, pp. 1-8.
Alper et al., "Quantum Mechanical Study of the Germanium Electron-Hole Bilayer Tunnel FET," IEEE Transactions on Electron Devices, vol. 60, No. 9, Sep. 2013, pp. 2754-2760.
Anghel et al., "30-nm Tunnel FET With Improved Performance and Reduced Ambipolar Current," IEEE Transactions on Electron Devices, vol. 58, No. 6, Jun. 2011, pp. 1649-1654.
Asra et al., "A Tunnel FET for VDD Scaling Below 0.6 V With a CMOS-Comparable Performance," IEEE Transactions on Electron Devices, vol. 58, No. 7, Jul. 2011, pp. 1855-1863.
Bal et al., "Performance estimation of sub-30 nm junctionless tunnel FET," Journal of Computational Electronics, Jun. 28, 2013, 8 pages.
Beneventi et al., "Dual-Metal-Gate InAs Tunnel FET With Enhanced Turn-On Steepness and High ON-Current," IEEE Transactions on Electron Devices, vol. 61, No. 3, Mar. 2014, pp. 776-784.
Bhardwaj et al., "TFET Simulation using Matlab and Sentaraus TCAD," IEEE International Conference on Advances in Computing, Communications and Informatics (ICACCI), Sep. 21-24, 2016, pp. 1238-1244.
Bhuwalka et al., "Vertical Tunnel Field-Effect Transistor," IEEE Transactions on Electron Devices, vol. 51, No. 2, Feb. 2004, pp. 279-282.
Bhuwalka et al., "Scaling the Vertical Tunnel FET With Tunnel Bandgap Modulation and Gate Workfunction Engineering," IEEE Transactions on Electron Devices, vol. 52, No. 5, May 2005, pp. 909-917.
Bhuwalka et al., "P-Channel Tunnel Field-Effect Transistors down to Sub-50nm Channel Lengths," Japanese Journal of Applied Physics, vol. 45, No. 4B, 2006, pp. 3106-3109.
Bijesh et al., "Demonstration of In0.9Ga0.1As/GaAs0.18Sb0.82 Near Broken-gap Tunnel FET with ION=740?A/?m, GM=700?S/?m and Gigahertz Switching Performance at VDS=0.5V," IEEE, 2013, pp. IEDM13-687-IEDM13-690.
Boucart et al., "Double Gate Tunnel FET with ultrathin silicon body and high-k gate dielectric," IEEE, 2006, pp. 383-386.
Boucart et al., "Length scaling of the Double Gate Tunnel FET with a high-K gate dielectric," Solid-State Electronics, vol. 51, Nov. 7, 2007, pp. 1500-1507.

(56) References Cited

OTHER PUBLICATIONS

Boucart et al., "Lateral Strain Profile as Key Technology Booster for All-Silicon Tunnel FETs," IEEE Electron Device Letters, vol. 30, No. 6, Jun. 2009, pp. 656-658.
Boucart et al., "Double-Gate Tunnel FET With High-? Gate Dielectric," IEEE Transactions on Electron Devices, vol. 54, No. 7, Jul. 2007, pp. 1725-1733.
Chang et al., "Improved Subthreshold and Output Characteristics of Source-Pocket Si Tunnel FET by the Application of Laser Annealing," IEEE Transactions on Electron Devices, vol. 60, No. 1, Jan. 2013, pp. 92-96.
Datta et al., "Tunnel FET technology: A reliability perspective," Microelectronics Reliability, vol. 54, 2014, pp. 861-874.
Fan et al., "Analysis of Single-Trap-Induced Random Telegraph Noise and Its Interaction With Work Function Variation for Tunnel FET," IEEE Transactions on Electron Devices, vol. 60, No. 6, Jun. 2013, pp. 2038-2044.
Fiori et al., "Ultralow-Voltage Bilayer Graphene Tunnel FET," IEEE Electron Device Letters, vol. 30, No. 10, Oct. 2009, pp. 1096-1098.
Huang et al., "A Novel Si Tunnel FET with 36mV/dec Subthreshold Slope Based on Junction Depleted-Modulation through Striped Gate Configuration," IEEE, 2012, pp. IEDM12-187-IEDM12-190.
Hurkx et al., "A New Recombination Model for Device Simulation Including Tunneling," IEEE Transactions on Electron Devices, vol. 39, No. 2, Feb. 1992, pp. 331-338.
Ionescu et al., "Tunnel field-effect transistors as energy-efficient electronic switches," Nature, vol. 479, Nov. 17, 2011, pp. 329-337.
Kane, E. O., "Zener Tunneling in Semiconductors," Journal of Physics and Chemistry of Solids, vol. 12, 1959, pp. 181-188.
Knoch, J., "Optimizing Tunnel FET Performance—Impact of Device Structure, Transistor Dimensions and Choice of Material," IEEE, 2009, pp. 45-46.
Lattanzio et al., "Electron-Hole Bilayer Tunnel FET for Steep Subthreshold Swing and Improved ON Current," IEEE, 2011, pp. 259-262.
Lattanzio et al., "Complementary Germanium Electron-Hole Bilayer Tunnel FET for Sub-0.5-V Operation," IEEE Electron Device Letters, vol. 33, No. 2, Feb. 2012, pp. 167-169.
Lu et al., "Tunnel Field-Effect Transistors: State-of-the-Art," Journal of the Electron Devices Society, vol. 2, No. 4, Jul. 2014, pp. 44-49.
Lu et al., "Universal analytic model for tunnel FET circuit simulation," Solid-State Electronics, 2015, pp. 1-8.
Mayer et al., "Impact of SOI, Si1—xGexOI and GeOI substrates on CMOS compatible Tunnel FET performance," IEEE International Electron Devices Meeting, 2008, 5 pages.
Mookerjea et al., "Effective Capacitance and Drive Current for Tunnel FET (TFET) CV/I Estimation," IEEE Transactions on Electron Devices, vol. 56, No. 9, Sep. 2009, pp. 2092-2098.
Pal et al., "Insights Into the Design and Optimization of Tunnel-FET Devices and Circuits," IEEE Transactions on Electron Devices, vol. 58, No. 4, Apr. 2011, pp. 1045-1053.
Patel et al., "Drive current boosting of n-type tunnel FET with strained SiGe layer at source," Microelectronics Journal, vol. 39, 2008, pp. 1671-1677.
Rajamohanan et al., "0.5 V Supply Voltage Operation of In0.65Ga0.35As/GaAs0.4Sb0.6 Tunnel FET," IEEE Electron Device Letters, vol. 36, No. 1, Jan. 2015, pp. 20-22.
Rooyackers et al., "A New Complementary Hetero-Junction Vertical Tunnel-FET Integration Scheme," IEEE, 2013, pp. IEDM13-92-IEDM13-95.
Saripalli et al., "Variation-Tolerant Ultra Low-Power Heterojunction Tunnel FET SRAM Design," IEEE, 2011, pp. 45-52.
Schenk et al., "Rigorous Theory and Simplified Model of the Band-To-Band Tunneling in Silicon," Solid-State Electronics, vol. 36, No. 1, 1993, pp. 19-34.
Vrani et al., "Optimization of Hetero Junction n-channel Tunnel FET with High-k Spacers," IEEE 2nd International Workshop on Electron Devices and Semiconductor Technology, 2009, pp. 1-6.

Zener, C., "A Theory of the Electrical Breakdown of Solid Dielectrics," Proceedings of the Royal Society A, vol. 145, 1934, pp. 523-529.
Kim et al., U.S. Appl. No. 15/855,953, filed Dec. 27, 2017.
Yeung et al., "Programming Characteristics of the Steep Turn-on/off Feedback FET (FBFET)," Symposium on VLSI Technology Digest of Technical Papers, 2009, pp. 176-177.
Ida et al., "Super Steep Subthreshold Slope PN-Body Tied SOI FET with Ultra Low Drain Voltage down to 0.1V," IEEE, 2015, pp. IEDM15-624-IEDM15-627.
Padilla et al., "Feedback FET: A Novel Transistor Exhibiting Steep Switching Behavior at Low Bias Voltages," Electron Devices Meeting, IEEE, 2008, 4 pages.
Lu et al., "Realizing Super-Steep Subthreshold Slope with Conventional FDSOI CMOS at Low-Bias Voltages," Electron Devices Meeting, IEEE International, Dec. 2010, pp. 1-3.
Jimenez et al., "Analytic model for the surface potential and drain current in negative capacitance field-effect transistors," IEEE Transactions on Electron Devices, vol. 57, No. 10, Oct. 2010, pp. 1-15.
Khan et al., "Negative Capacitance in a Ferroelectric Capacitor," Nature Materials, Apr. 2014, with Supplementary Online Information, 40 pages retrieved from https://arxiv.org/vc/arxiv/papers/1409/1409.3273v1.pdf.
Saeidi et al., "Negative Capacitance Field Effect Transistors; Capacitance Matching and non-Hysteretic Operation," European Union, 2017, pp. 78-81.
Appleby et al., "Experimental Observation of Negative Capacitance in Ferroelectrics at Room Temperature," Nano Letters, Mar. 19, 2014, 5 pages.
Catalan et al., "Negative capacitance detected," Nature Materials, vol. 14, Feb. 2015, pp. 137-139.
Naber et al., "High-performance solution-processed polymer ferroelectric field-effect transistors," Nature Materials, vol. 4, Mar. 2005, pp. 243-248.
Frank et al., "The Quantum Metal Ferroelectric Field-Effect Transistor," IEEE Transactions on Electron Devices, vol. 61, No. 6, Jun. 2014, pp. 2145-2153.
Gao et al., "Room-Temperature Negative Capacitance in a Ferroelectric-Dielectric Superlattice Heterostructure," Nano Letters, Sep. 22, 2014, pp. 5814-5819.
Jo et al., "Negative Capacitance Field Effect Transistor with Hysteresis-Free Sub-60-mV/decade Switching," IEEE Electron Device Letters, 2015, pp. 1-4.
Khan et al., "Negative capacitance in a ferroelectric capacitor," Nature Materials, vol. 14, Feb. 2015, pp. 182-186.
Mathews et al., "Ferroelectric Field Effect Transistor Based on Epitaxial Perovskite Heterostructures," Science, vol. 276, Apr. 11, 1997, pp. 238-240.
Mcguire et al., "Sustained sub-60 mV/decade switching via the negative capacitance effect in MoS2 transistors," Nano Letters, Jul. 10, 2017, 19 pages.
Rusu et al., "Metal-Ferroelectric-Metal-Oxide-Semiconductor Field Effect Transistor with Sub-60mV/decade Subthreshold Swing and Internal Voltage Amplification," IEEE, 2010, 4 pages.
Salahuddin et al., "Use of Negative Capacitance to Provide Voltage Amplification for Low Power Nanoscale Devices," Nano letters, vol. 8, No. 2, 2008, pp. 405-410.
Salvatore et al., "Experimental confirmation of temperature dependent negative capacitance in ferroelectric field effect transistor," Applied Physics Letters, vol. 100, Apr. 2012, 5 pages.
Zhirnov et al., "Negative capacitance to the rescue?" Nature Nanotechnology, Nanoelectronics, vol. 3, Feb. 2008, pp. 77-78.
Kam et al., "A New Nano-Electro-Mechanical Field Effect Transistor (NEMFET) Design for Low-Power Electronics," IEEE, 2005, pp. 1-4.
Abele et al., "Suspended-Gate MOSFET: bringing new MEMS functionality into solid-state MOS transistor," IEEE, 2005, pp. 1-3.
Park et al., "Inkjet-Printed Micro-Electro-Mechanical Switches," IEEE, 2011, pp. 665-668.
Ionescu et al., "Modeling and Design of a Low-Voltage SOI Suspended-Gate MOSFET (SG-MOSFET) with a Metal-Over-Gate Architecture," Proceedings of the International Symposium on Quality Electronic Design, 2002, 6 pages.

(56) References Cited

OTHER PUBLICATIONS

Jeon et al., "Perfectly Complementary Relay Design for Digital Logic Applications," IEEE Electron Device Letters, vol. 31, No. 4, Apr. 2010, pp. 371-373.
Abele et al., "1T MEMS Memory Based on Suspended Gate MOSFET," IEEE International Electron Devices Meeting, 2006, 4 pages.
Akarvardar et al., "Design Considerations for Complementary Nanoelectromechanical Logic Gates," IEEE 2007, pp. 299-302.
Czaplewski et al., "A nanomechanical switch for integration with CMOS logic," Journal of Micromechanics and Microengineering, vol. 19, 2009, 13 pages.
Enachescu et al., "Ultra Low Power NEMFET Based Logic," IEEE, 2013, pp. 566-569.
Han et al., "FinFACT-Fin Flip-FlopActuated Channel Transistor," IEEE Electron Device Letters, vol. 31, No. 7, Jul. 2010, pp. 764-766.
Grogg et al., "NEM Switch Technologies for Low-Power Logic Applications," IEEE, 2012, pp. 1-3.
Kam et al., "Design and Reliability of a Micro-Relay Technology for Zero-Standby-Power Digital Logic Applications," IEEE International Electron Devices Meeting, 2009, pp. 1-3.
Jain et al., "Prospects of Hysteresis-Free Abrupt Switching (0 mV/decade) in Landau Switches," IEEE Transactions on Electron Devices, vol. 60, No. 12, Dec. 2013, pp. 4269-4276.
Nagase et al. "Graphene-Based Nano-Electro-Mechanical Switch with High On/Off Ratio," Applied Physics Express, vol. 6, Apr. 2013, 4 pages.
Pott et al., "Mechanical Computing Redux: Relays for Integrated Circuit Applications," Proceedings of the IEEE, vol. 98, No. 12, Dec. 2010, pp. 2076-2094.
Unluer et al., "Steep Subthreshold Switching With Nanomechanical FET Relays," IEEE Transactions on Electron Devices, vol. 63, No. 4, Apr. 2016, pp. 1681-1688.
Singh et al., "Tunable piezoresistance and noise in gate-all-around nanowire field-effect-transistor," Applied Physics Letters, vol. 100, 2012, pp. 1-4.
Coquand et al., "Strain-Induced Performance Enhancement of Trigate and Omega-Gate Nanowire FETs Scaled Down to 10-nm Width," IEEE Transactions on Electron Devices, vol. 60, No. 2, Feb. 2013, pp. 727-732.
Bartsch et al., "Resonant-Body Fin-FETs with sub-nW power consumption," IEEE, 2010, pp. 174-177.
Es-Sakhi et al., "Partially Depleted Silicon-on-Ferroelectric Insulator Field Effect Transistor (PD-SOFFET)," IEEE, 16th Int'l Symposium on Quality Electronic Design, 2015, 5 pages.
Van Hemert et al., "Piezoelectric Strain Modulation in FETs," IEEE Transactions on Electron Devices, vol. 60, No. 10, Oct. 2013, pp. 3265-3270.
Hueting et al., "On Device Architectures, Subthreshold Swing, and Power Consumption of the Piezoelectric Field-Effect Transistor (?-FET)," Journal of Electron Devices Society, vol. 3, No. 3, May 2015, pp. 149-157.
Jana et al., "Sub-Boltzmann Transistors with Piezoelectric Gate Barriers," IEEE, 2013, 2 pages.
Jana et al., "Sub-60 mV/decade Steep Transistors with Compliant Piezoelectric Gate Barriers," IEEE, 2014, pp. 347-350.
Jana et al., "Transistor Switches Using Active Piezoelectric Gate Barriers," IEEE Journal on Exploratory Solid-State Computational Devices and Circuits, vol. 1, Jun. 2015, pp. 35-42.
Kaleli et al., "Integration of a Piezoelectric Layer on Si FinFETs for Tunable Strained Device Applications," IEEE Transactions on Electron Devices, vol. 61, No. 6, Jun. 2014, pp. 1929-1935.
Lee et al., "Steep Slope and Near Non-Hysteresis of FETs With Antiferroelectric-Like HfZrO for Low-Power Electronics," IEEE Electron Device Letters, vol. 36, No. 4, Apr. 2015, pp. 294-296.
Seabaugh et al., "Steep subthreshold swing tunnel FETs: GaN/InN/GaN and transition metal dichalcogenide channels," IEEE, 2015, pp. 919-922.
Yuan et al., "Normally Off AlGaN/GaN Metal-2DEG Tunnel-Junction Field-Effect Transistors," IEEE Electron Device Letters, vol. 32, No. 3, Mar. 2011, pp. 303-305.
Abelein et al., "Improved Reliability by Reduction of Hot-Electron Damage in the Vertical Impact-Ionization MOSFET (I-MOS)," IEEE Electron Device Letters, vol. 28, No. 1, Jan. 2007, pp. 65-67.
Lee et al., "Low subthreshold slope in junctionless multigate transistors," Applied Physics Letters, vol. 96, 2010, pp. 102106-1-102106-3.
Cao et al., "Improvement in Reliability of Tunneling Field-Effect Transistor With p-n-i-n Structure," IEEE Transactions on Electron Devices, vol. 58, No. 7, Jul. 2011, pp. 2122-2126.
Gopalakrishnan et al., Impact Ionization MOS (I-MOS)—Part I: Device and Circuit Simulations, IEEE Transactions on Electron Devices, vol. 52, No. 1, Jan. 2005, pp. 69-76.
Gopalakrishnan et al., "Impact Ionization MOS (I-MOS)—Part II: Experimental Results," IEEE Transactions on Electron Devices, vol. 52, No. 1, Jan. 2005, pp. 77-84.
Zhang et al., "A Schottky-Barrier Silicon FinFET with 6.0 mV/dec Subthreshold Slope over 5 Decades of Current," International Electron Devices Meeting (IEDM'14), Dec. 15-17, 2014, pp. 1-4.
Ramaswamy et al., "Junction-less Impact Ionization MOS (JIMOS): Proposal and Investigation," IEEE Transactions on Electron Devices, vol. 61, Dec. 2014, 4 pages.

* cited by examiner

STEEP SLOPE FIELD-EFFECT TRANSISTOR (FET) FOR A PERPENDICULAR MAGNETIC TUNNEL JUNCTION (PMTJ)

FIELD OF THE INVENTION

The present invention relates to magnetic random access memory (MRAM), and more particularly to a steep slope field-effect transistor (FET) for use in a perpendicular magnetic tunnel junction (pMTJ).

BACKGROUND

Magnetic Random Access Memory (MRAM) is a non-volatile data memory technology that stores data using magnetoresistive cells, such as Magnetoresistive Tunnel Junction (MTJ) elements. At their most basic level, such MTJ elements include first and second magnetic layers that are separated by a thin, non-magnetic tunnel barrier layer, which may be constructed of an insulating barrier material, such as MgO, $Al_2O_3$, etc. The first magnetic layer, which may be referred to as a reference layer, has a magnetization that is fixed in a direction that is perpendicular to that of a plane of the layer. The second magnetic layer has a magnetization that is free to move so that it may be oriented in either of two directions that are both generally perpendicular to the plane of the free magnetic layer. Therefore, the magnetization of the free layer may be either parallel with the magnetization of the reference layer or anti-parallel with the direction of the reference layer (i.e., opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. Each electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free layer and the reference layer are oriented in the same direction, the spin of the electrons in the free layer are generally in the same direction as the orientation of the spin of the electrons in the reference layer. Because these electron spins are generally in the same direction, the electrons may pass relatively easily through the tunnel barrier layer. However, if the orientations of the magnetizations of the free layer and the reference layer are opposite to one another, the spin of electrons in the free layer will generally be opposite to the spin of electrons in the reference layer. In this case, electrons do not easily pass through the barrier layer, resulting in a higher electrical resistance through the MTJ stack.

Because the MTJ element may be switched between low and high electrical resistance states, it may be used as a memory element to store data. For example, the low resistance state may be read as a "1" or one, whereas the high resistance state may be read as a "0" or zero. In addition, because the magnetic orientation of the magnetic free layer remains in its switched state without any electrical power being provided to the element, the memory storage provided by the MTJ element is robust and non-volatile.

To write a bit of data to the MTJ cell, the magnetic orientation of the magnetic free layer is switched from a first direction to a second direction that is 180° from the first direction. This may be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation.

Once the magnetization of the free layer has been switched by the current, the state of the MTJ element may be read by detecting a voltage across the MTJ element, thereby determining whether the MTJ element is in a "1" or "0" bit state. Advantageously, once the switching electrical current has been removed, the magnetic state of the free layer will remain in the switched orientation until some other time when an electrical current is applied to switch the MTJ element to the opposite state. Therefore, the recorded data bit is non-volatile in that it remains intact (the magnetic orientation of the free layer does not change) in the absence of any electrical current being supplied.

SUMMARY

According to one embodiment, an apparatus includes a bottom electrode layer positioned above a substrate in a film thickness direction, a source layer positioned above the bottom electrode layer in the film thickness direction, an impact ionization channel (i-channel) layer positioned above the source layer in the film thickness direction, a drain layer positioned above the i-channel layer in the film thickness direction, an upper electrode layer positioned above the drain layer in the film thickness direction that forms a stack that includes the bottom electrode layer, the source layer, the i-channel layer, the drain layer, and the upper electrode layer, and a gate layer positioned on sides of the i-channel layer along a plane perpendicular to the film thickness direction in an element width direction. The gate layer is positioned closer to the drain layer than the source layer.

In another embodiment, an apparatus includes a first bottom electrode layer positioned above a substrate in a film thickness direction, a first source layer positioned above the first bottom electrode layer in the film thickness direction, a first i-channel layer positioned above the first source layer in the film thickness direction, a first drain layer positioned above the first i-channel layer in the film thickness direction, a first upper electrode layer positioned above the first drain layer in the film thickness direction that forms a first stack that includes the first bottom electrode layer, the first source layer, the first i-channel layer, the first drain layer, and the first upper electrode layer, a first gate layer positioned on sides of the first i-channel layer along a plane perpendicular to the film thickness direction in an element width direction, the first gate layer being positioned closer to the first drain layer than the first source layer, a perpendicular magnetic tunnel junction (pMTJ) structure positioned above the first upper electrode layer that is electrically coupled to the first upper electrode layer, a second bottom electrode layer positioned above the pMTJ in the film thickness direction that is electrically coupled to the pMTJ, a second drain layer positioned above the second bottom electrode layer in the film thickness direction, the second drain layer being electrically coupled to the pMTJ, a second i-channel layer positioned above the second drain layer in the film thickness direction, a second source layer positioned above the second i-channel layer in the film thickness direction, a second upper electrode layer positioned above the second source layer in the film thickness direction that forms a second stack that includes the second bottom electrode layer, the second drain layer, the second i-channel layer, the second source layer, and the second upper electrode layer, and a second gate layer positioned on sides of the second i-channel layer along the plane perpendicular to the film thickness direction in the element width direction. The second gate layer is positioned closer to the second drain layer than the second source layer.

In accordance with another embodiment, an apparatus includes a substrate, an electrically conductive channel positioned within a portion of the substrate, a first impact ionization metal-oxide semiconductor (I-MOS) positioned above the substrate in a film thickness direction, the first I-MOS including a first steep slope field-effect transistor (FET). The electrically conductive channel is electrically coupled to the first I-MOS. The apparatus also includes a pMTJ structure positioned above the first I-MOS in the film thickness direction, the pMTJ being electrically coupled in series to the first I-MOS, and a second I-MOS positioned above the pMTJ in the film thickness direction, the second I-MOS including a second steep slope FET, with the pMTJ being electrically coupled in series to the second I-MOS.

These and other features and advantages of the invention will be apparent to one of skill in the art upon reading of the following detailed description of the embodiments in conjunction with the figures. In the figures, like reference numerals used in more than one figure indicate a like element, and may be considered in light of the description of the like element presented in any of the other figures having the like element.

BRIEF DESCRIPTION OF THE DRAWINGS

For a fuller understanding of the nature and advantages of this invention, as well as the preferred mode of use, reference should be made to the following detailed description read in conjunction with the accompanying drawings. The drawings are not presented to scale unless specified otherwise on an individual basis.

DETAILED DESCRIPTION

Figure 1:
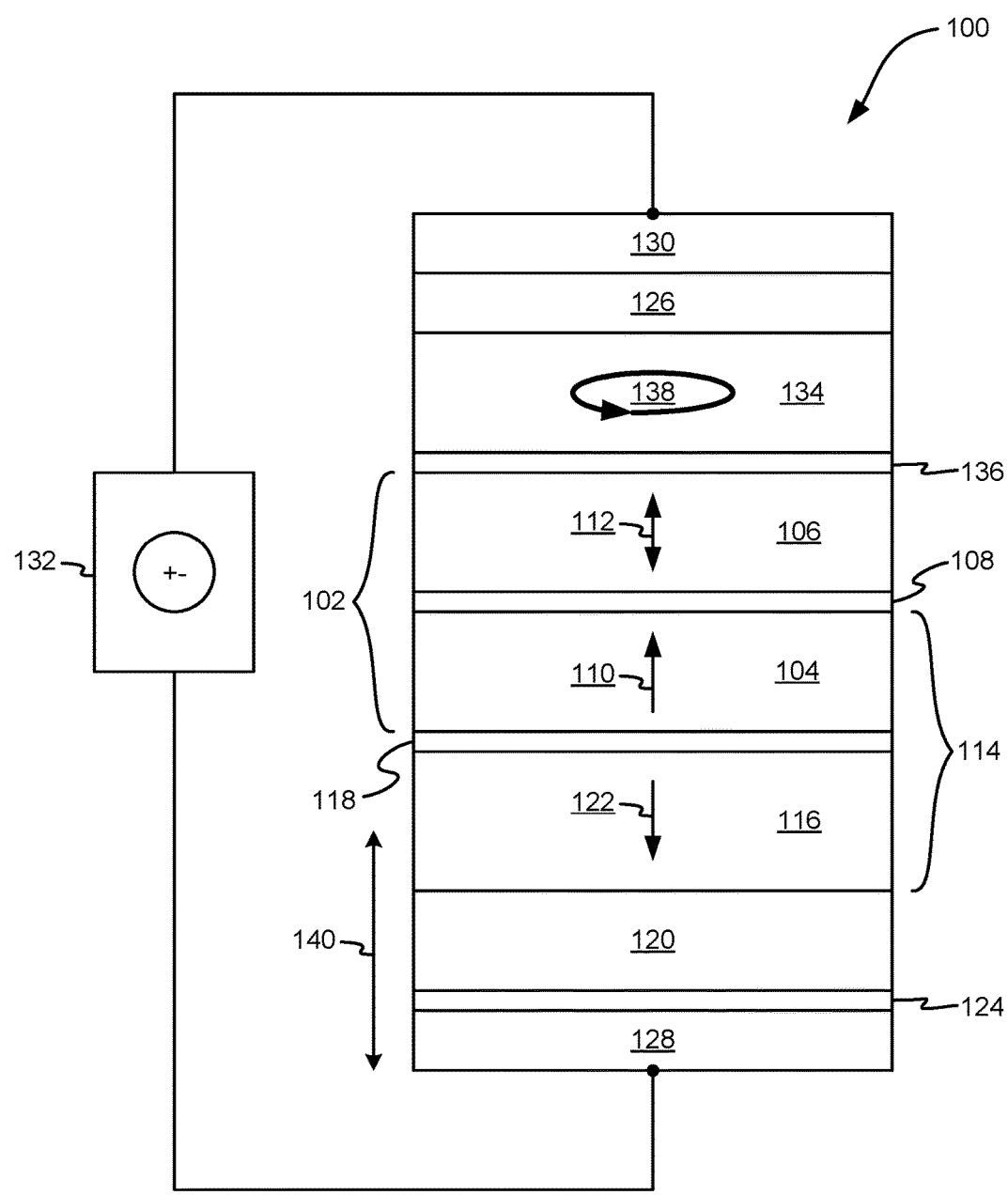
FIG. 1 is a schematic, cross-sectional view of a portion of a magnetic memory element, which may be used in embodiments of the invention.

The following description includes the best embodiments presently contemplated for carrying out the invention. This description is made for the purpose of illustrating the general principles of this invention and is not meant to limit the inventive concepts claimed herein in any way.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an," and "the" include plural referents unless otherwise specified.

Moreover, the term "about" when used herein to modify a value indicates a range that includes the value and less and greater than the value within a reasonable range. In the absence of any other indication, this reasonable range is plus and minus 10% of the value. For example, "about 10 nanometers" indicates 10 nm±1 nm, such that the range includes all values in a range including 9 nm up to and including 11 nm.

Also, the term "comprise" indicates an inclusive list of those elements specifically described without exclusion of any other elements. For example, "a list comprises red and green" indicates that the list includes, but is not limited to, red and green. Therefore, the list may also include other colors not specifically described.

According to one general embodiment, an apparatus includes a bottom electrode layer positioned above a substrate in a film thickness direction, a source layer positioned above the bottom electrode layer in the film thickness direction, an impact ionization channel (i-channel) layer positioned above the source layer in the film thickness direction, a drain layer positioned above the i-channel layer in the film thickness direction, an upper electrode layer positioned above the drain layer in the film thickness direction that forms a stack that includes the bottom electrode layer, the source layer, the i-channel layer, the drain layer, and the upper electrode layer, and a gate layer positioned on sides of the i-channel layer along a plane perpendicular to the film thickness direction in an element width direction. The gate layer is positioned closer to the drain layer than the source layer.

In another general embodiment, an apparatus includes a first bottom electrode layer positioned above a substrate in a film thickness direction, a first source layer positioned above the first bottom electrode layer in the film thickness direction, a first i-channel layer positioned above the first source layer in the film thickness direction, a first drain layer positioned above the first i-channel layer in the film thickness direction, a first upper electrode layer positioned above the first drain layer in the film thickness direction that forms a first stack that includes the first bottom electrode layer, the first source layer, the first i-channel layer, the first drain layer, and the first upper electrode layer, a first gate layer positioned on sides of the first i-channel layer along a plane perpendicular to the film thickness direction in an element width direction, the first gate layer being positioned closer to the first drain layer than the first source layer, a perpendicular magnetic tunnel junction (pMTJ) structure positioned above the first upper electrode layer that is electrically coupled to the first upper electrode layer, a second bottom electrode layer positioned above the pMTJ in the film thickness direction that is electrically coupled to the pMTJ, a second drain layer positioned above the second bottom electrode layer in the film thickness direction, the second drain layer being electrically coupled to the pMTJ, a second i-channel layer positioned above the second drain layer in the film thickness direction, a second source layer positioned above the second i-channel layer in the film thickness direction, a second upper electrode layer positioned above the second source layer in the film thickness direction that forms a second stack that includes the second bottom electrode layer, the second drain layer, the second i-channel layer, the second source layer, and the second upper electrode layer, and a second gate layer positioned on sides of the second i-channel layer along the plane perpendicular to the film thickness direction in the element width direction. The second gate layer is positioned closer to the second drain layer than the second source layer.

In accordance with another general embodiment, an apparatus includes a substrate, an electrically conductive channel positioned within a portion of the substrate, a first impact ionization metal-oxide semiconductor (I-MOS) positioned above the substrate in a film thickness direction, the first I-MOS including a first steep slope field-effect transistor (FET). The electrically conductive channel is electrically coupled to the first I-MOS. The apparatus also includes a pMTJ structure positioned above the first I-MOS in the film thickness direction, the pMTJ being electrically coupled in series to the first I-MOS, and a second I-MOS positioned above the pMTJ in the film thickness direction, the second I-MOS including a second steep slope FET, with the pMTJ being electrically coupled in series to the second I-MOS.

Referring to FIG. 1, a magnetic memory element 100 is shown according to one embodiment. The memory element 100 may be used in a perpendicular magnetic tunnel junction (pMTJ) memory element, as described in various embodiments herein. The memory element 100 may include a magnetic tunnel junction (MTJ) 102 that may include a magnetic reference layer 104, a magnetic free layer 106, and a thin, non-magnetic, electrically-insulating magnetic barrier layer 108 positioned between the reference layer 104 and the free layer 106 in a film thickness direction 140. The barrier layer 108 may include an oxide, such as MgO, $Al_2O_3$, etc., or some other suitable material known in the art. The reference layer 104 has a magnetization 110 that is fixed in a direction that is perpendicular to a horizontal plane of the layer, as indicated by the arrow. The horizontal plane is sometimes referred to as a plane of formation in the embodiments described herein. The free layer 106 has a magnetization 112 that may be in either of two directions perpendicular to a horizontal plane of the free layer 106, as indicated by the two arrows. While the magnetization 112 of the free layer 106 remains in either of two directions perpendicular to the plane of the free layer 106 in a quiescent state, it may be selectable switched between these two directions, as is described in greater detail herein. When the magnetization 112 of the free layer 106 is in the same direction as the magnetization 110 of the reference layer 104, the electrical resistance across the MTJ 102 is at a low resistance state. Conversely, when the magnetization 112 of the free layer 106 is opposite to the magnetization 110 of the reference layer 104, the electrical resistance across the MTJ 102 is in a high resistance state.

The reference layer 104 may be part of an anti-parallel magnetic pinning structure 114 that may include a magnetic pinned layer 116 and a non-magnetic, antiparallel coupling layer 118 positioned between the pinned layer 116 and the reference layer 104 in the film thickness direction 140. The antiparallel coupling layer 118 may comprise any suitable material known in the art, such as Ru, and may be constructed to have a thickness that causes ferromagnetic antiparallel coupling of the pinned layer 116 and the reference layer 104.

In one approach, the pinned layer 116 may be exchange coupled with an antiferromagnetic layer 120, which may comprise any suitable material known in the art, such as IrMn. Exchange coupling between the antiferromagnetic layer 120 and the pinned layer 116 strongly pins the magnetization 122 of the pinned layer 116 in a first direction. The antiparallel coupling between the pinned layer 116 and the reference layer 104 pins the magnetization 110 of the reference layer 104 in a second direction opposite to the direction of magnetization 122 of the pinned layer 116.

According to one approach, a seed layer 124 may be positioned below the pinned layer 116 in the film thickness direction 140 to initiate a desired crystalline structure in the layers deposited thereabove.

In another approach, a capping layer 126 may be positioned above the free layer 106 to protect the underlying layers during manufacture, such as during high temperature annealing.

A lower electrode 128 and an upper electrode 130 may be positioned near a bottom and a top of the memory element 100, respectively, in one approach. The lower electrode 128 and the upper electrode 130 may be constructed of a non-magnetic, electrically conductive material of a type known in the art, such as Ru, Au, Ag, Cu, etc., and may provide an electrical connection with a circuit 132. The circuit 132 may include a current source, and may further include circuitry for reading an electrical resistance across the memory element 100.

The magnetic free layer 106 has a magnetic anisotropy that causes the magnetization 112 of the free layer 106 to remain stable in one of two directions perpendicular to the horizontal plane of the free layer 106. In a write mode of use for the memory element 100, the orientation of the magnetization 112 of the free layer 106 may be switched between these two directions by applying an electrical current through the memory element 100 via the circuit 132. A current in a first direction causes the magnetization 112 of the free layer 106 of the memory element 100 to flip to a first orientation, and a current in a second direction opposite to the first direction causes the magnetization 112 of the free layer 106 of the memory element 100 to flip to a second, opposite direction.

For example, if the magnetization 112 is initially oriented in an upward direction in FIG. 1, applying a current in a downward direction through the memory element 100 causes electrons to flow in an opposite direction upward through the memory element 100. Electrons travelling through the reference layer 104 become spin polarized as a result of the magnetization 110 of the reference layer 104. These spin-polarized electrons cause a spin torque on the magnetization 112 of the free layer 106, which causes the magnetization 112 to flip directions, from the upward direction to a downward direction.

On the other hand, if the magnetization 112 of the free layer 106 is initially in a downward direction in FIG. 1, applying an electrical current through the memory element 100 in an upward direction in FIG. 1 causes electrons to flow in an opposite direction, downward through the memory element 100. However, because the magnetization 112 of the free layer 106 is opposite to the magnetization 110 of the reference layer 104, the electrons will not be able to pass through the barrier layer 108. As a result, the electrons (which have been spin polarized by the magnetization 112 of the free layer 106) will accumulate at the junction between the free layer 106 and the barrier layer 108. This accumulation of spin polarized electrons causes a spin torque that causes the magnetization 112 of the free layer 106 to flip from the downward direction to an upward direction.

In order to assist the switching of the magnetization 112 of the free layer 106, the memory element 100 may include a spin polarization layer 134 positioned above the free layer 106. The spin polarization layer 134 may be separated from the free layer 106 by an exchange coupling layer 136. The spin polarization layer 134 has a magnetic anisotropy that causes it to have a magnetization 138 with a primary component oriented in the in plane direction (e.g., perpendicular to the magnetization 112 of the free layer and the magnetization 110 of the reference layer 104). The magnetization 138 of the spin polarization layer 134 may be fixed in one approach, or may move in a precessional manner as shown in FIG. 1. The magnetization 138 of the spin polarization layer 134 causes a spin torque on the free layer 106 that assists in moving its magnetization 112 away from its quiescent state perpendicular to the plane of the free layer 106. This allows the magnetization 112 of the free layer 106 to more easily flip with less energy being utilized to flip the magnetization 112 in response to applying a write current to the memory element 100.

The memory element 100 described in FIG. 1 is intended to provide context to the various embodiments described herein. The structures and methods described herein in accordance with various embodiments may comprise a portion of the memory element 100 described in FIG. 1 and/or used in conjunction with the memory element 100, in various approaches.

Figure 2:
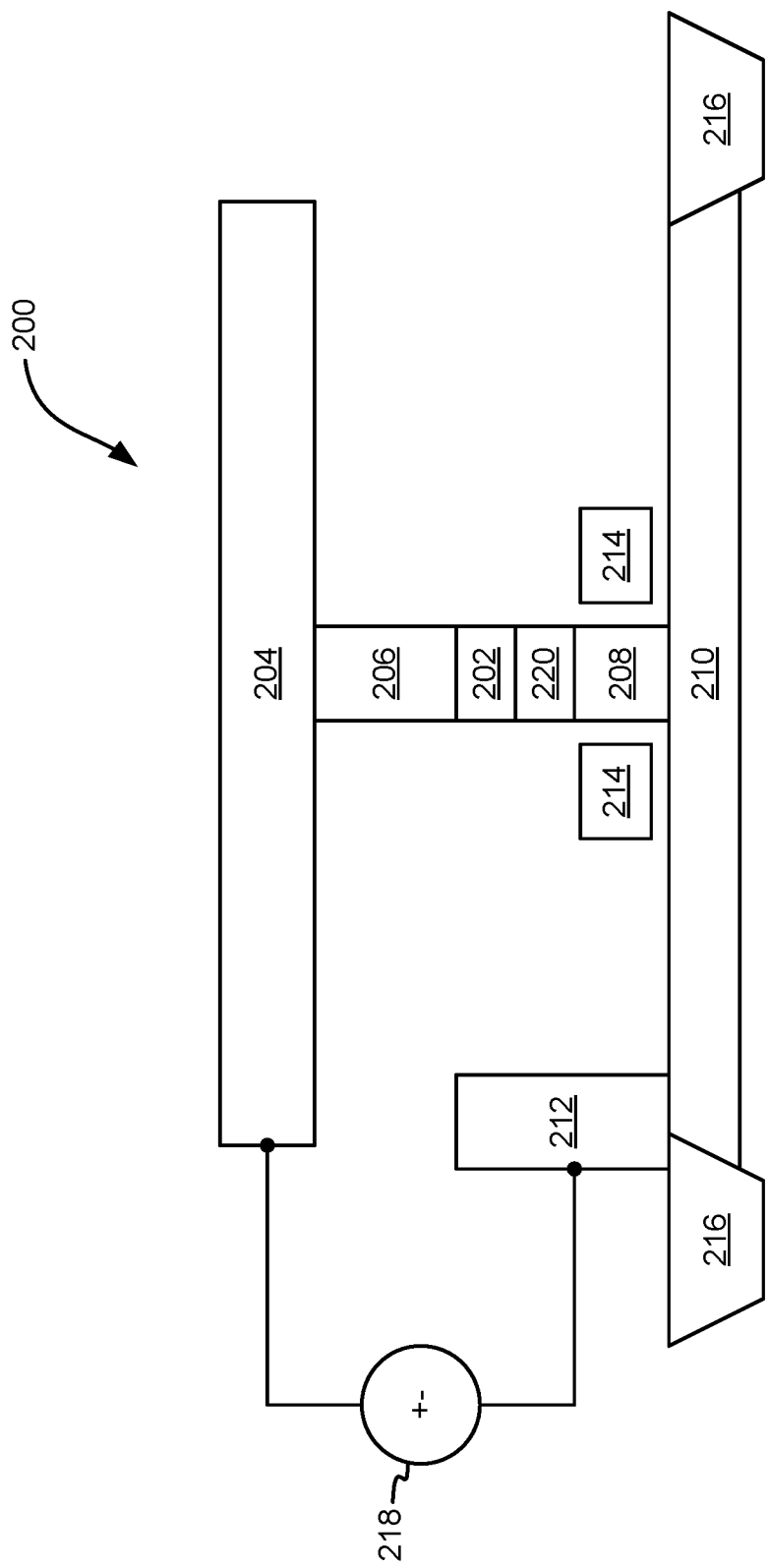
FIG. 2 is a schematic, cross-sectional view of a portion of a magnetic random access memory (MRAM) that includes a magnetoresistive cell, which may be used in embodiments of the invention.

Now referring to FIG. 2, a portion of a magnetic random access memory (MRAM) structure 200 that includes a magnetoresistive sensor 202 is shown according to one embodiment. The MRAM structure 200 may be operated and utilized as understood by those of skill in the art, with any special use cases being specified in accordance with an embodiment herein. The memory element 100 described in FIG. 1 may be used as the magnetoresistive sensor 202 of FIG. 2 in accordance with embodiments that store data in MRAM. In one embodiment, an MTJ element may be used as the magnetoresistive sensor 202.

The MRAM structure 200 includes a bit line 204 that supplies current across the magnetoresistive sensor 202 from a voltage source 218. The bit line 204 may comprise any suitable material known in the art, such as TaN, W, TiN, Au, Ag, Cu, etc. An extension layer 206 electrically couples the magnetoresistive sensor 202 with the bit line 204. The extension layer 206 may comprise any suitable material known in the art, such as Ru, Ta, etc. A source terminal 220 is coupled between the magnetoresistive sensor 202 and a channel layer 208, which is in electrical contact with a n+ source layer 210. The channel layer 208 may comprise any suitable semiconductor material known in the art, such as Si, Ge, GaAs-compounds, etc. The n+ source layer 210 may comprise any suitable material known in the art, such as TaN, W, TiN, Au. Ag, Cu, etc., and is electrically coupled to the voltage source 218 via a source line 212, which may comprise any suitable material known in the art, such as TaN, W, TiN, Au, Ag, Cu, etc. Positioned across the channel layer 208 is a word line 214 which may comprise any suitable material known in the art, such as TaN, W, TiN, Au, Ag, Cu, etc. On either side of the n+ source layer 210 are shallow trench isolation (STI) layers 216 which provide electrical insulation between an adjacent n+ source layer 210. Moreover, although not specifically shown, electrically insulative material may be positioned around the various layers shown in FIG. 2, as would be understood by one of skill in the art.

The ability to scale a pMTJ to make it larger heavily depends on the size of the access transistor, which handles a large programming current during operation of the pMTJ. In one embodiment, impact ionization phenomena may be utilized to provide additional current drive capability using any given dimensions for the access transistor. Stringent reliability requirements for the access transistor may be undermined for memory applications due to the limited pMTJ reliability. The device structure may comprise a polysilicon structure which relieves a backed process temperature requirement. Several device structures and fabrication methods which are useful for three-dimensional pMTJ memory integration are disclosed herein, in various embodiments.

Figure 3A:
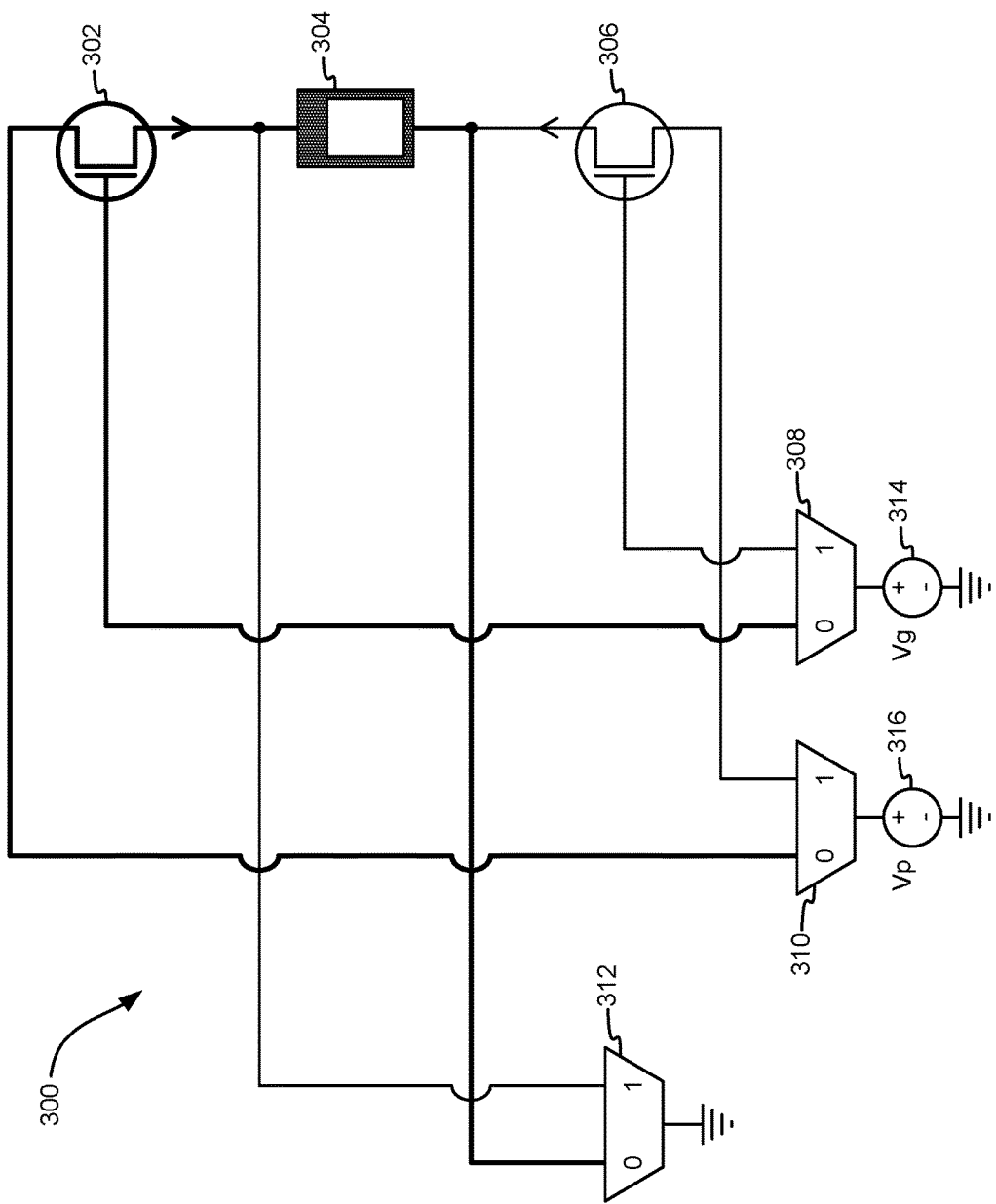
FIG. 3A shows a simplified diagram of a circuit for writing a "0" bit, in one embodiment.

With reference to FIG. 3A, a circuit 300 that may be used in writing data to a magnetic medium is shown according to one embodiment. The circuit 300 includes a first impact ionization metal-oxide semiconductor (I-MOS) 302 positioned on a first side of a pMTJ 304, with a second I-MOS 306 being positioned on a second side of the pMTJ 304. Placing the first I-MOS 302 in a complementary position to the second I-MOS 306 about the pMTJ 304 provides for bidirectional programmability of the pMTJ 304. Each I-MOS 302, 306 includes a steep slope-field-effect transistor (FET) or impact ionization FET, which may be considered a unidirectional current carrying device due to its use to direct current in a single direction of flow during use. Other types of FETs which may be used, according to various embodiments, in each I-MOS 302, 306 include, but are not limited to: Avalanche FETs, Tunneling FETs, Nanomechanical FETs, Piezoelectric FETs, Feedback FETs, Ferroelectric FETs, etc.

The steep slope-FET of each I-MOS 302, 306 is configured to have larger current drivability than a contemporary FET (with a given silicon layout), such that it is configured to drive up to about 100 microAmp (μA) in current when the transistor is designed to minimum size in length and width (about 28 nm and smaller), with a write operating current draw of about 60-75 μA for pMTJ 304 memory operation. This enhanced current drivability (the amount of current that may directed by the FET) may be due, at least in part, by the impact ionization, or some other factor when using a different FET design. During a writing operation, the supply voltage is well below about 1 volt (V), which leads to a steep slope-FET being used in each I-MOS 302, 306 as an access transistor according to embodiments described herein.

In addition, two additional metallization layers are used due to asymmetric current flow through each I-MOS 302, 306. The lack of saturation of drain current in the steep slope-FET design is also acceptable for use as an access transistor, and the reliability of each I-MOS 302, 306, which is always connected in series with the pMTJ 304 (which acts as a resistor) is enhanced. Therefore, the circuit 300 is expected to have a lifetime suitable for use in a memory system, such as MRAM, static random access memory (SRAM), etc.

Referring to FIG. 3A, a first input of the first I-MOS 302 is electrically coupled to a zero bit output of a source line multiplexer (MUX) 310, and is electrically coupled to a zero bit output of a word line MUX 308 on a second input. The word line MUX 308 is electrically coupled to a gate voltage (Vg) 314 which provides gate voltage, selectively, to both the zero bit output and a one bit output of the word line MUX 308. The source line MUX 310 is electrically coupled to a program voltage (Vp) 316 which provides source current, selectively, to both the zero bit output and a one bit output of the source line MUX 310. The pMTJ is electrically coupled, on both sides thereof, to a bit line MUX 312, which is used to dictate which bit ("0" or "1") is being written by the circuit 300 at any given time.

In operation, and as shown in FIG. 3A, in order to write a "0" bit, the first I-MOS 302 is utilized to direct source current from the zero bit output of the source line MUX 310 and gate voltage from the zero bit output of the word line MUX 308 toward the inputs of the first I-MOS 302, which unifies the direction of output therefrom toward the bit line MUX 312 along the zero bit input thereof. This causes a "0" bit to be written to the magnetic medium via the bit line MUX 312. The path of current flow is illustrated along the electrical connections that are shown in bold in FIG. 3A.

Figure 3B:
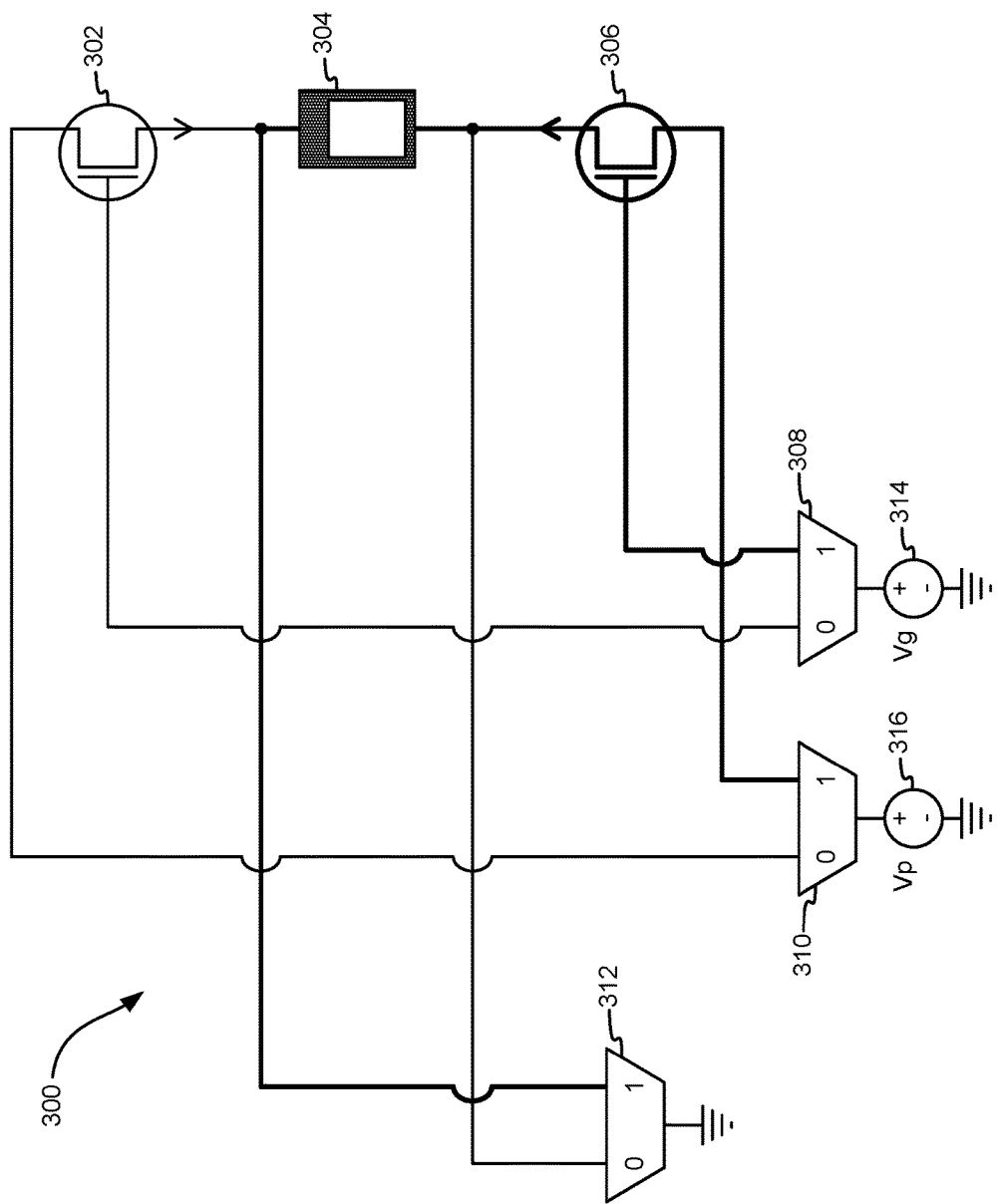
FIG. 3B shows a simplified diagram of a circuit for writing a "1" bit, in one embodiment.

Now referring to FIG. 3B, in order to write a "1" bit to the magnetic medium, the second I-MOS 306 is utilized to direct gate current from the one bit output of the source line MUX 310 and gate voltage from the one bit output of the word line MUX 308 toward the inputs of the second I-MOS 306, which unifies the direction of output therefrom toward the bit line MUX 312 along the one bit input thereof. This causes a "1" bit to be written to the magnetic medium via the bit line MUX 312. The path of current flow for writing a one is illustrated along the electrical connections that are shown in bold in FIG. 3B.

Figure 4:
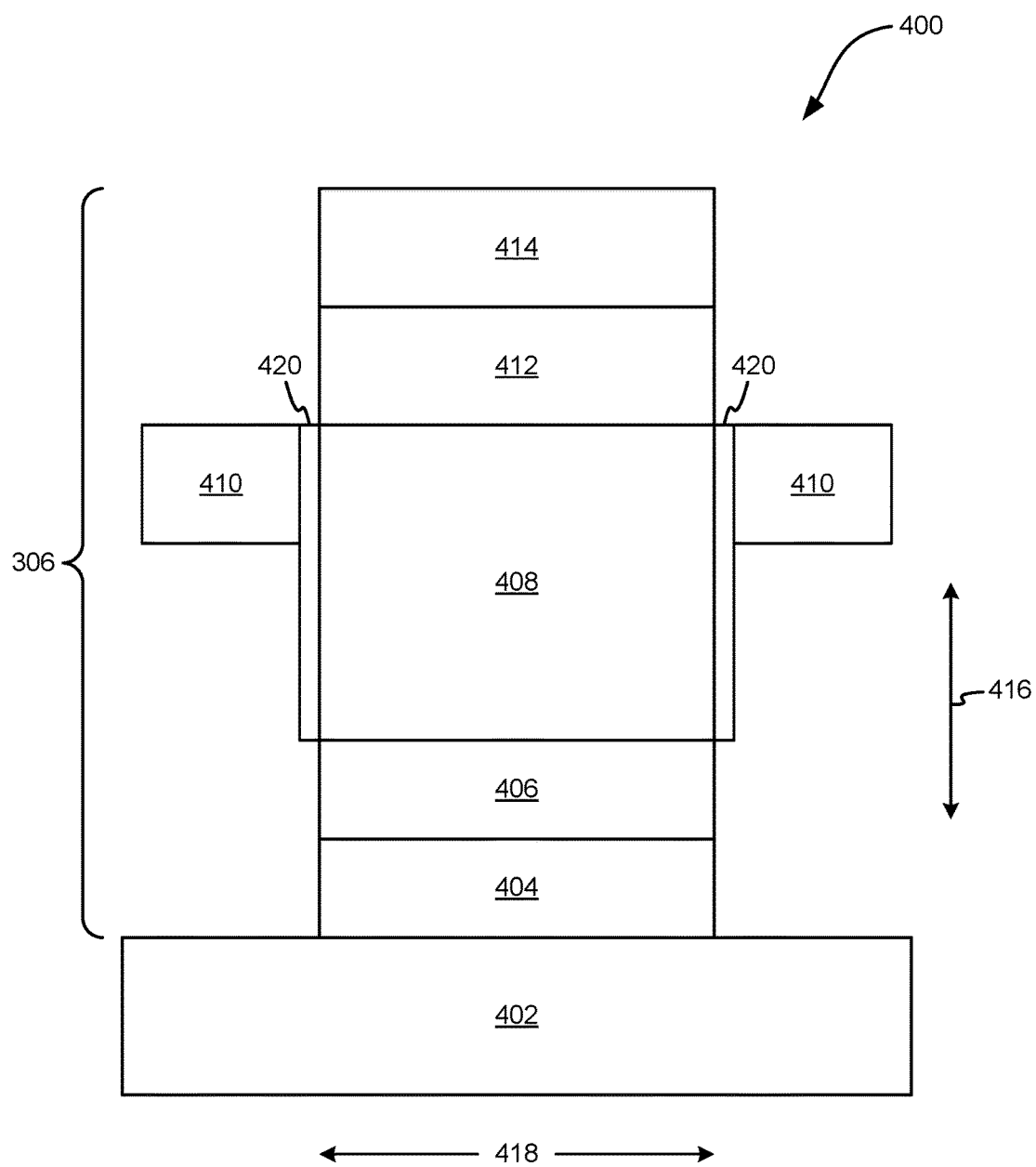
FIG. 4 shows a simplified diagram of a steep slope-field-effect transistor (FET) structure, in one embodiment.

Now referring to FIG. 4, a steep slope-FET structure 400 is shown according to one embodiment. The steep slope-FET structure 400 or some portion thereof (such as the layers positioned above the substrate 402) may be used in the various embodiments disclosed herein, such as in an I-MOS and/or in a memory device, such as a MRAM, SRAM, etc.

The steep slope-FET structure 400 comprises a substrate 402, a bottom electrode layer 404 (also referred to as a bit line) positioned above the substrate 402 in a film thickness direction 416 (the direction in which layers grow as material is added and shrink as material is removed). The steep slope-FET structure 400 also includes a source layer 406 (also referred to as a source p+) positioned above the bottom electrode layer 404 in the film thickness direction 416, an impact ionization channel ("i-channel") layer 408 positioned above the source layer 406 in the film thickness direction 416, a drain layer 412 (also referred to as a drain n+) positioned above the i-channel layer 408 in the film thickness direction 416, and an upper electrode layer 414 (also referred to as a hardmask when formed of a material capable of being used as a masking layer) positioned above the drain layer 412 in the film thickness direction 416. Together, these layers may be referred to as a stack. In addition, the steep slope-FET structure 400 includes a gate layer 410 positioned on sides of the i-channel layer 408 along a plane perpendicular to the film thickness direction 416 (and at least in an element width direction 418 perpendicular to the film thickness direction 416). In a further embodiment, the gate layer 410 may be positioned on all sides of the i-channel layer 408 (like a donut that surrounds the pillar structure, when viewed from above). The gate layer 410 is electrically isolated from the i-channel layer 408 on each side thereof by a gate dielectric layer 420, which is positioned between the gate layer 410 and the i-channel layer 408. In a further approach, as shown in FIG. 4, the gate dielectric layer 420 may be positioned along sides of the i-channel layer 408 for an extent thereof in the film thickness direction 416. The gate layer 410 may be positioned closer to the drain layer 412 than the source layer 406, in one embodiment. All of the layers of the steep slope-FET structure 400, except for the substrate 402, comprises an I-MOS, such as I-MOS 306 in the orientation shown in FIGS. 3A-3B.

Referring again to FIG. 4, according to one embodiment, an electrically conductive channel may be positioned in a center position that travels through the substrate 402 in the film thickness direction 416 that is configured to electrically couple to the bottom electrode layer 404.

The substrate 402 may comprise any suitable material known in the art, such as $SiO_2$, $Al_2O_3$, MgO, etc. In several embodiments, the bottom electrode layer 404 may comprise TaN, TiNi, TiN, TiW, similar suitable materials known in the art, and/or a combinations thereof. In one specific embodiment, the bottom electrode layer 404 may be formed of at least one material selected from the group consisting of TaN, TiNi, TiN, and TiW.

In accordance with more embodiments, the source layer 406 may comprise Si doped with B and/or similar suitable materials known in the art.

In additional embodiments, the i-channel layer 408 may comprise undoped Si, Ge, SiGe, similar suitable materials known in the art, and/or combinations thereof. In one specific embodiment, the i-channel layer 408 may be formed of at least one material selected from the group consisting of undoped Si, Ge, and SiGe.

According to several approaches, the drain layer 412 may comprise Si doped with P, Si doped with Ar, Si doped with an alkaline metal (e.g., Be, Mg, Ca, Sr, Ba, and/or Ra), similar suitable materials known in the art, and/or combinations thereof.

In more approaches, the upper electrode layer 414 may comprise TaN, TiNi, TiN, TiW, similar suitable materials known in the art, and/or a combinations thereof. In one specific embodiment, the upper electrode layer 414 may be formed of at least one material selected from the group consisting of TaN, TiNi, TiN, and TiW.

In even more approaches, the gate layer 410 may comprise doped polysilicon, W, TaN, TiNi, TiN, similar suitable materials, and/or combination thereof. In one specific approach, the gate dielectric layer 420 may comprise any suitable material known in the art that provides electrical insulation, such as $SiO_2$, SiON, $ZrO_2$, $HfO_2$, and $Al_2O_3$, combinations thereof, etc.

More layers may be included in the steep slope-FET structure 400 to provide insulation, electrical connectivity, and/or to further enhance or define the structure, as would be understood by one of skill in the art upon reading the present descriptions.

Figure 5:
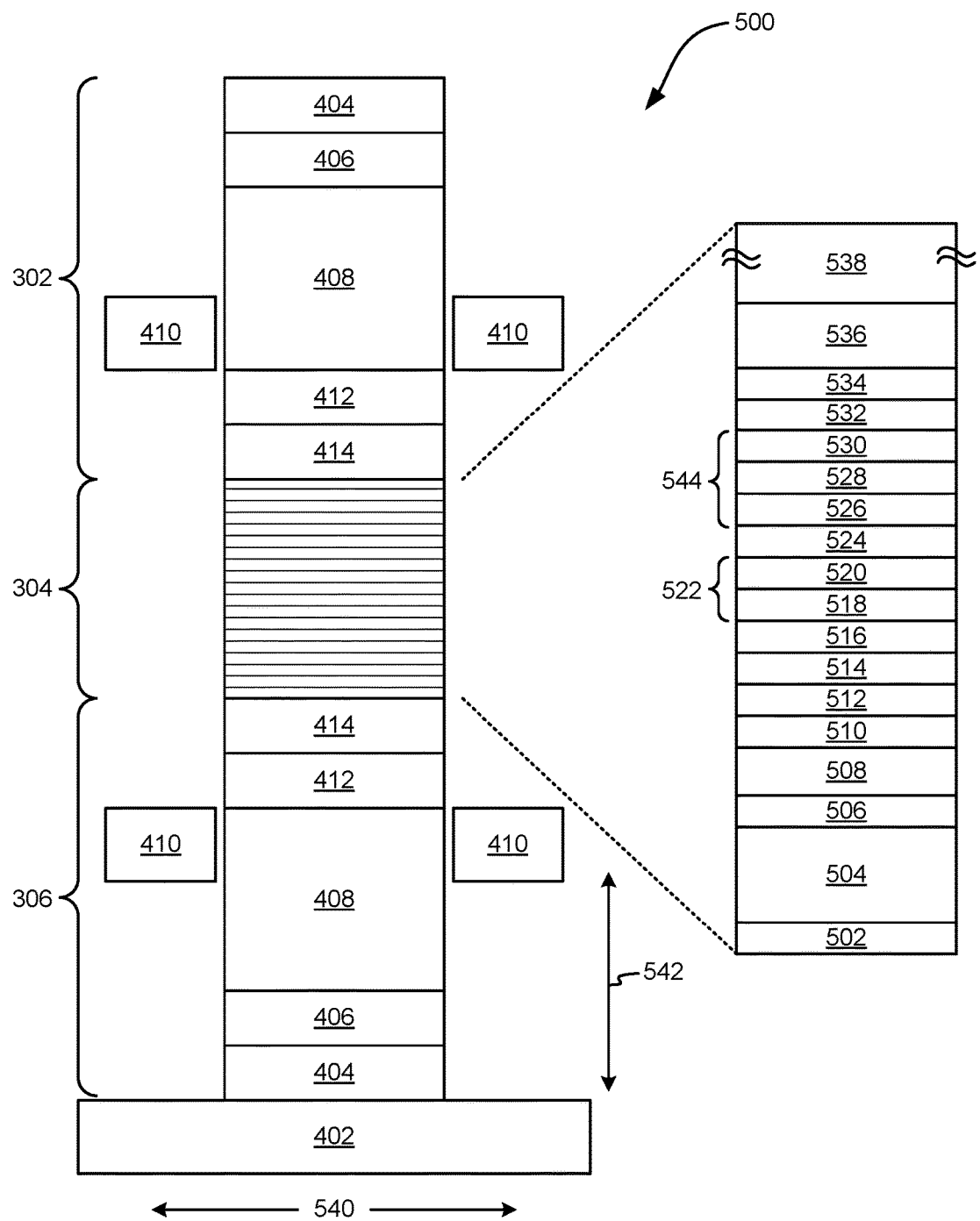
FIG. 5 shows a simplified diagram of a structure that includes a first impact ionization metal-oxide semiconductor (I-MOS), a perpendicular magnetic tunnel junction (pMTJ), and a second I-MOS, in one embodiment.

With reference to FIG. 5, a structure 500 is shown that includes the first I-MOS 302, the pMTJ 304, and the second I-MOS 306, arranged in series and electrically coupled together. The second I-MOS 306 may be positioned above a substrate 402, and may comprise a bottom electrode layer 404 (also referred to as a bit line) positioned above the substrate 402 in a film thickness direction 542, a source layer 406 (also referred to as a source p+) positioned above the bottom electrode layer 404, an i-channel layer 408 positioned above the source layer 406, a drain layer 412 (also referred to as a drain n+) positioned above the i-channel layer 408, an upper electrode layer 414 (also referred to as a hardmask when formed of a material capable of being used as a masking layer) positioned above the drain layer 412, and a gate layer 410 positioned on sides of the i-channel layer 408 along a plane perpendicular to the film thickness direction 542 at least in an element width direction 540 (possibly on all sides of the pillar structure). The gate layer 410 may be positioned closer to the drain layer 412 than the source layer 406, in one embodiment.

Moreover, positioned between the second I-MOS 306 and the first I-MOS 302 is the pMTJ 304, which comprises a plurality of layers, and may be formed using any process known in the art. In this description, above and below are in reference to the film thickness direction 542.

The pMTJ 304 is described below in accordance with several embodiments. The pMTJ 304 may comprise a seed layer 502, an underlayer 504 positioned above the seed layer 502, a synthetic antiferromagnetic (SAF) seed layer 506 positioned above the underlayer 504, a first SAF layer 508 positioned above the SAF seed layer 506, a spacer layer 510 positioned above the first SAF layer 508, an antiferromagnetic (AFM) coupling layer 512 positioned above the spacer layer 510, a second SAF layer 514 positioned above the AFM coupling layer 512, a ferromagnetic (FM) coupling layer 516 positioned above the second SAF layer 514, a reference layer 522 that comprises a first reference layer 518 positioned below a second reference layer 520, a barrier layer 524 positioned above the reference layer 522, a free layer 544 which includes a lower free layer 526 positioned above the barrier layer 524, a middle free layer 528 positioned above the lower free layer 526, and an upper free layer 530 positioned above the middle free layer 528. The pMTJ 304 also comprises a first cap layer 532 positioned above the upper free layer 530, a second cap layer 534 positioned above the first cap layer 532, a third cap layer 536 positioned above the second cap layer 534, and a fourth cap layer 538 positioned above the third cap layer 536.

According to one embodiment, the seed layer 502 may be formed above a poly-crystalline layer that includes many grain boundaries, such as TaN. The seed layer 502 may act to stop texture propagation from this poly-crystalline layer. Otherwise, the grain structure of the poly-crystalline layer may propagate upward in the structure. The seed layer 502 may comprise Ta and/or a suitable material known in the art and may have a thickness of about 1 nm.

The underlayer 504 may be used to facilitate recrystallization of the subsequently formed SAF layers during post-pMTJ annealing. It may comprise Ru and/or a suitable material known in the art and may have a thickness of about 3 nm.

The SAF seed layer 506 may comprise Pt and/or a suitable material known in the art and may have a thickness of about 0.25 nm. It may be used to spur growth of the first SAF layer 508. The first SAF layer 508 exhibits a strong perpendicular anisotropy field, and may comprise CoPt and/or a suitable material known in the art, with a thickness of about 1.5 nm. The spacer layer 510 may comprise Co and/or a suitable material known in the art and may have a thickness of about 0.35 nm.

The AFM coupling layer 512 may comprise Ru and/or a suitable material known in the art, with a thickness of about 0.85 nm. The AFM coupling layer 512 is positioned between the first and second SAF layers to cause the second SAF layer 514 to have antiferromagnetic coupling with the first SAF layer 508. The second SAF layer 514 may comprise Co and/or a suitable material known in the art and may have a thickness of about 0.9 nm.

The FM coupling layer 516 may comprise Mo and/or a suitable material known in the art, with a thickness of about 0.35 nm. The FM coupling layer 516 may provide ferromagnetic-coupling between the second SAF layer 514 and the reference layer 522.

The first reference layer 518 may comprise CoFeB40 and/or a suitable material known in the art, with a thickness of about 0.5 nm, while the second reference layer 520 may comprise CoFeB30 and/or a suitable material known in the art, with a thickness of about 0.3 nm. The reference layer 522 has different compositions along the film thickness direction 542. In one embodiment, a higher Fe concentration is present in the second reference layer 520 for more spin-polarized current, while a higher Co concentration is present in the first reference layer 518 for better coupling with the second SAF layer 514.

The barrier layer 524 may comprise MgO and/or a suitable material known in the art, with an average roughness of about RA=7. The barrier layer 524 may be deposited using DC sputtering where metallic Mg is deposited and subsequently oxidized with oxygen in order to form MgO.

A wetting layer may be positioned above the barrier layer 524, in one embodiment. The wetting layer is a very thin layer which causes an upper surface of the MgO of the barrier layer 524 to become sticky, thereby prohibiting island formation during subsequent CoFeB deposition of the lower free layer 526. This wetting layer may be deposited at a low temperature (about 100K) and comprise a few (e.g., three to one hundred) monolayers of Fe, in one approach.

The lower free layer 526 may comprise CoFeB20 and/or a suitable material known in the art, with a thickness of about 1.4 nm. The middle free layer 528 may comprise W and/or a suitable material known in the art, with a thickness of about 0.3 nm, and the upper free layer 530 may comprise CoFeB20 and/or a suitable material known in the art, with a thickness of about 0.6 nm. The free layer 544 is configured to flip magnetic orientation in the presence of spin-torque current. The W of the middle free layer 528 blocks B diffusion through the middle free layer 528, while also gathering and trapping the B inside the W material.

The first cap layer 532 may comprise MgO and/or a suitable material known in the art and may have an average roughness of about RA=1.0, the second cap layer 534 may comprise CoFeB20 and/or a suitable material known in the art and may have a thickness of about 0.6 nm, the third cap layer 536 may comprise Ta and/or a suitable material known in the art and may have a thickness of about 3 nm, and the fourth cap layer 538 may comprise Ru and/or a suitable material known in the art and may have a thickness of about 10 nm. The collection of capping layers act to block metallic ion diffusion from above, and to resist pMTJ 304 metallization. Ru is widely used to electrically extend the pMTJ 304 to another electrical terminal that may be positioned and/or formed above the pMTJ 304.

The structure 500 further includes the first I-MOS 302 positioned above the pMTJ 304. The first I-MOS 302 may comprise a bottom electrode layer 414 positioned above the pMTJ 304, a drain layer 412 (also referred to as a drain n+) positioned above the bottom electrode layer 414, an i-channel layer 408 positioned above the drain layer 412, a source layer 406 (also referred to as a source p+) positioned above the i-channel layer 408, an upper electrode layer 404 (also referred to as a hardmask when formed of a material capable of being used as a masking layer) positioned above the source layer 406, and a gate layer 410 positioned on sides of the i-channel layer 408 along a plane perpendicular to the film thickness direction 542 in the element width direction 540. The gate layer 410 may be positioned closer to the drain layer 412 than the source layer 406, in one embodiment. Moreover, in one embodiment, the gate layer 410 may be formed completely around the pillar structure on all sides thereof (like a donut that surrounds the pillar).

Now referring to FIGS. 6A-6H, a method for forming an I-MOS is shown according to one embodiment. The method may be performed in accordance with the present invention in any of the environments depicted in FIGS. 1-5, among others not specifically described, in various approaches. Of course, more or less operations than those specifically described in FIGS. 6A-6H may be included in method, as would be understood by one of skill in the art upon reading the present descriptions.

Each of the operations of method may be performed by any suitable component of the operating environment. For example, in various embodiments, the method may be partially or entirely performed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to perform one or more operations of the method. Illustrative processing circuits include, but are not limited to, a central processing circuit (CPU), an application specific integrated circuit (ASIC), a field programmable gate array (FPGA), etc., combinations thereof, or any other suitable computing device known in the art.

In the descriptions of the formation of the various layers in FIGS. 6A-6H, each layer may be formed using any known deposition process, such as sputtering, plating, chemical vapor deposition (CVD), plasma chemical vapor deposition (pCVD), physical vapor deposition (PVD), molecular beam epitaxy (MBE), atomic layer deposition (ALD), etc. Moreover, any descriptions of removal of layers and/or material may be performed using any material removal process of a type known in the art, such as planarization, chemical mechanical polishing (CMP), recess etching, reactive ion etching (RIE), ion milling, plasma etching, photolithography, etc.

Figure 6A:
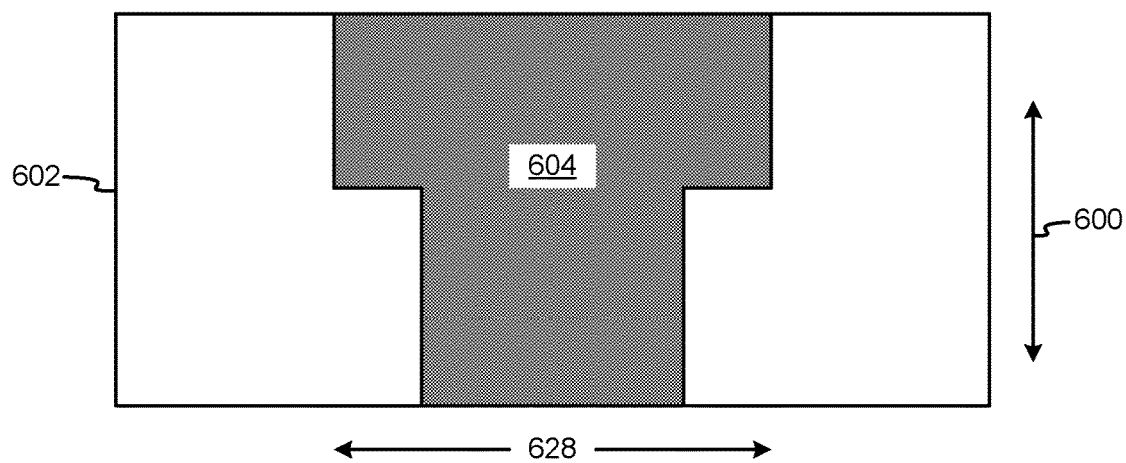
FIGS. 6A-6H show various structures created during manufacture of a steep slope-FET structure, in one embodiment.

With reference to FIG. 6A, a substrate 602 is formed and/or acquired. The substrate 602 may have an electrically conductive channel 604 formed therethrough in the film thickness direction that is configured to electrically couple to one or more layers formed thereon, in some approaches.

Figure 6B:
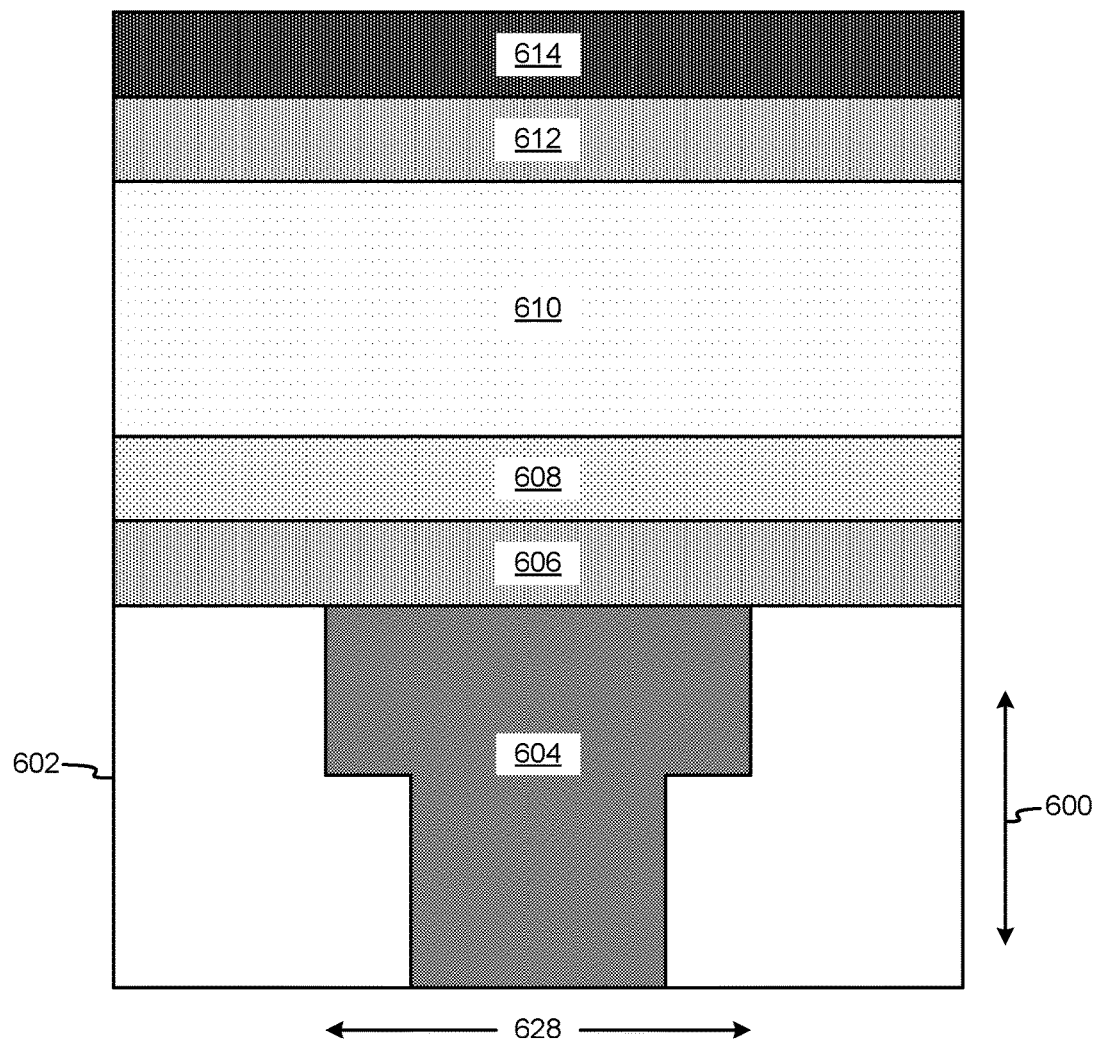

In FIG. 6B, a bottom electrode layer 606 is formed above the substrate 602 (and possibly the electrically conductive channel 604 in some approaches) in the film thickness direction 600. Also, a source layer 608 is formed above the bottom electrode layer 606, an impact ionization channel (i-channel) layer 610 is formed above the source layer 608, a drain layer 612 is formed above the i-channel layer 610, and a hardmask 614 is formed above the drain layer 612 to form a stack.

Figure 6C:
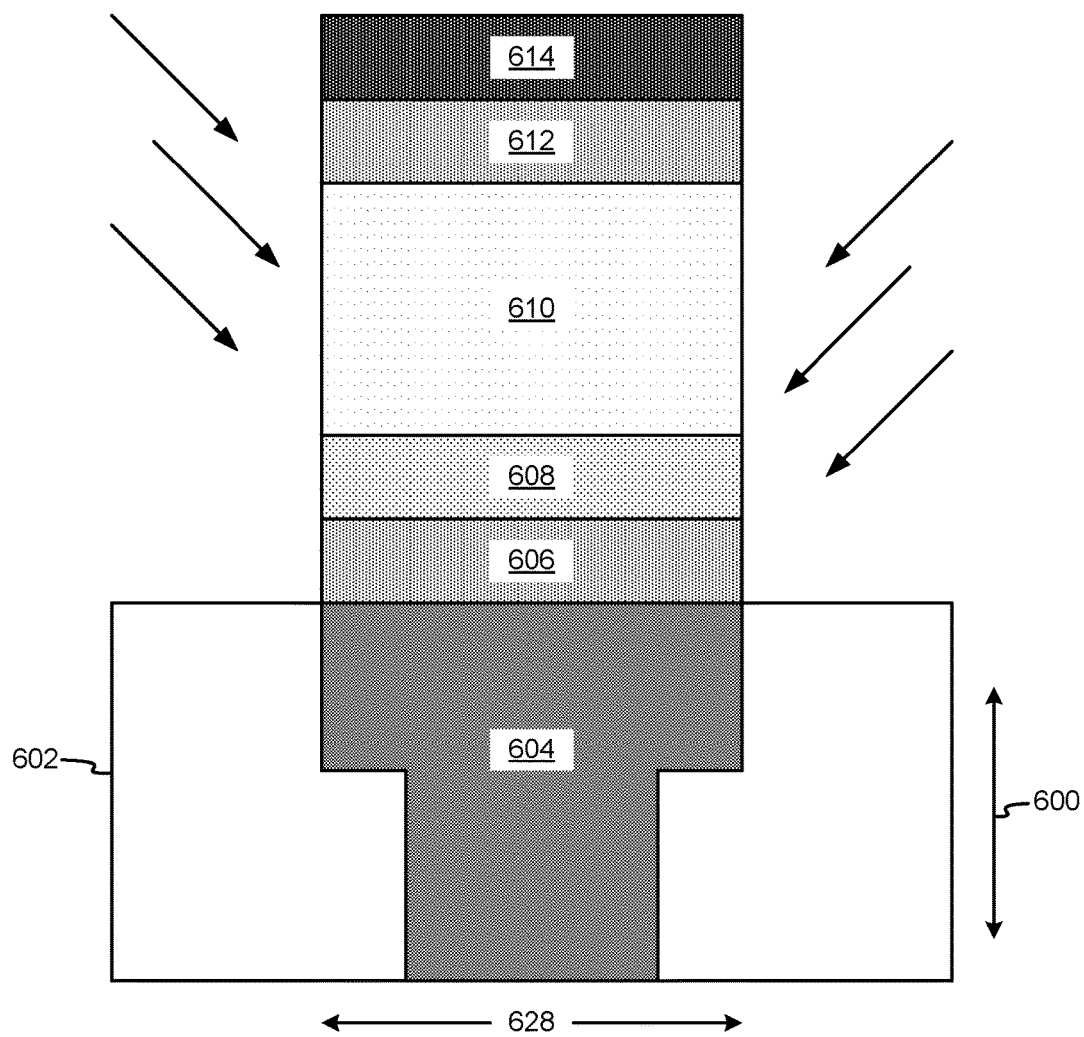

As shown in FIG. 6C, the stack is patterned into a pillar via a material removal process. This material removal process controls the width of the pillar in the element width direction 628.

Figure 6D:
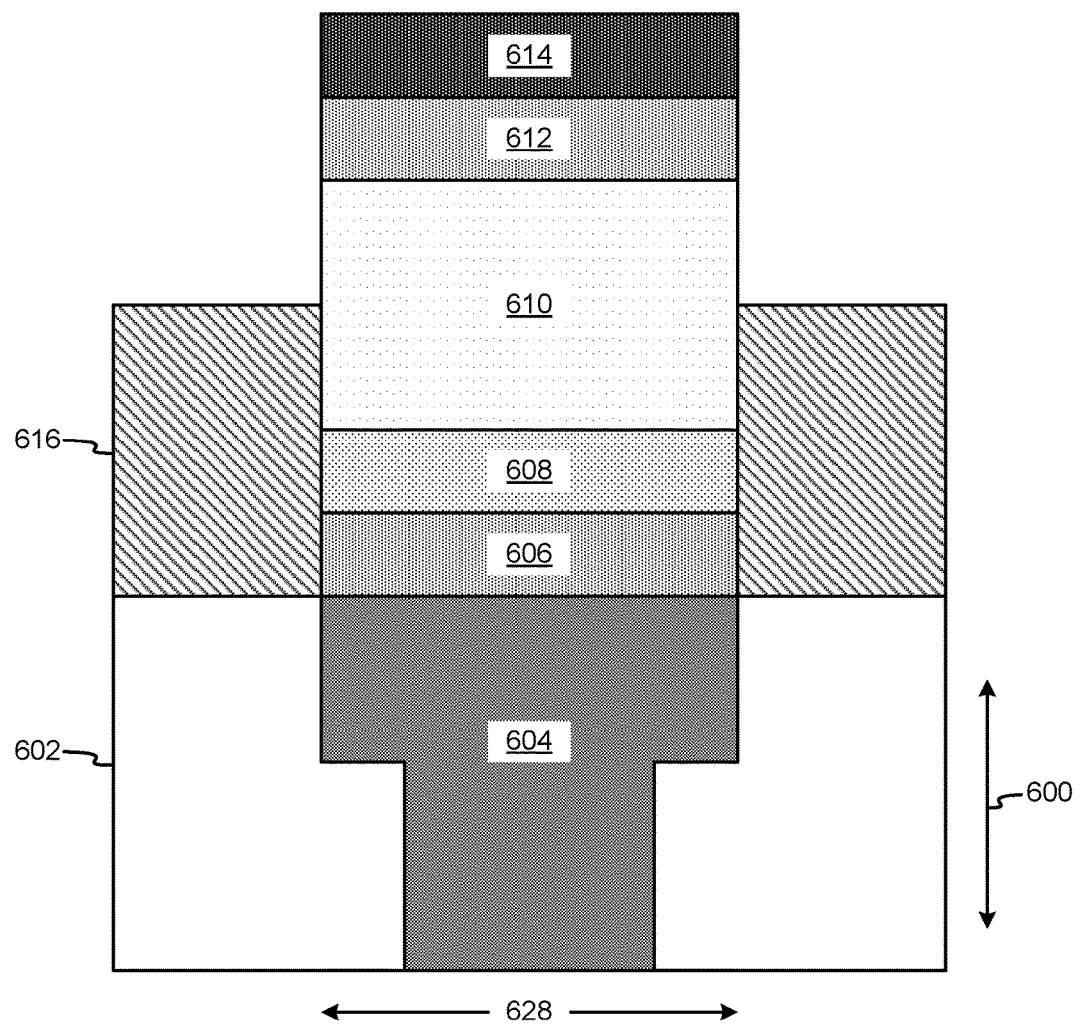

In FIG. 6D, an insulation layer 616 is formed around the pillar to a level of the i-channel layer 610 in the film thickness direction 600 consistent with a desired lower extent of a subsequently formed gate layer. The insulation layer 616 may be formed full film, then planarized and subsequently recess etched (using the hardmask 614 as a pattern) to the desired level consistent with the level at which formation of the gate layer will be performed.

Figure 6E:
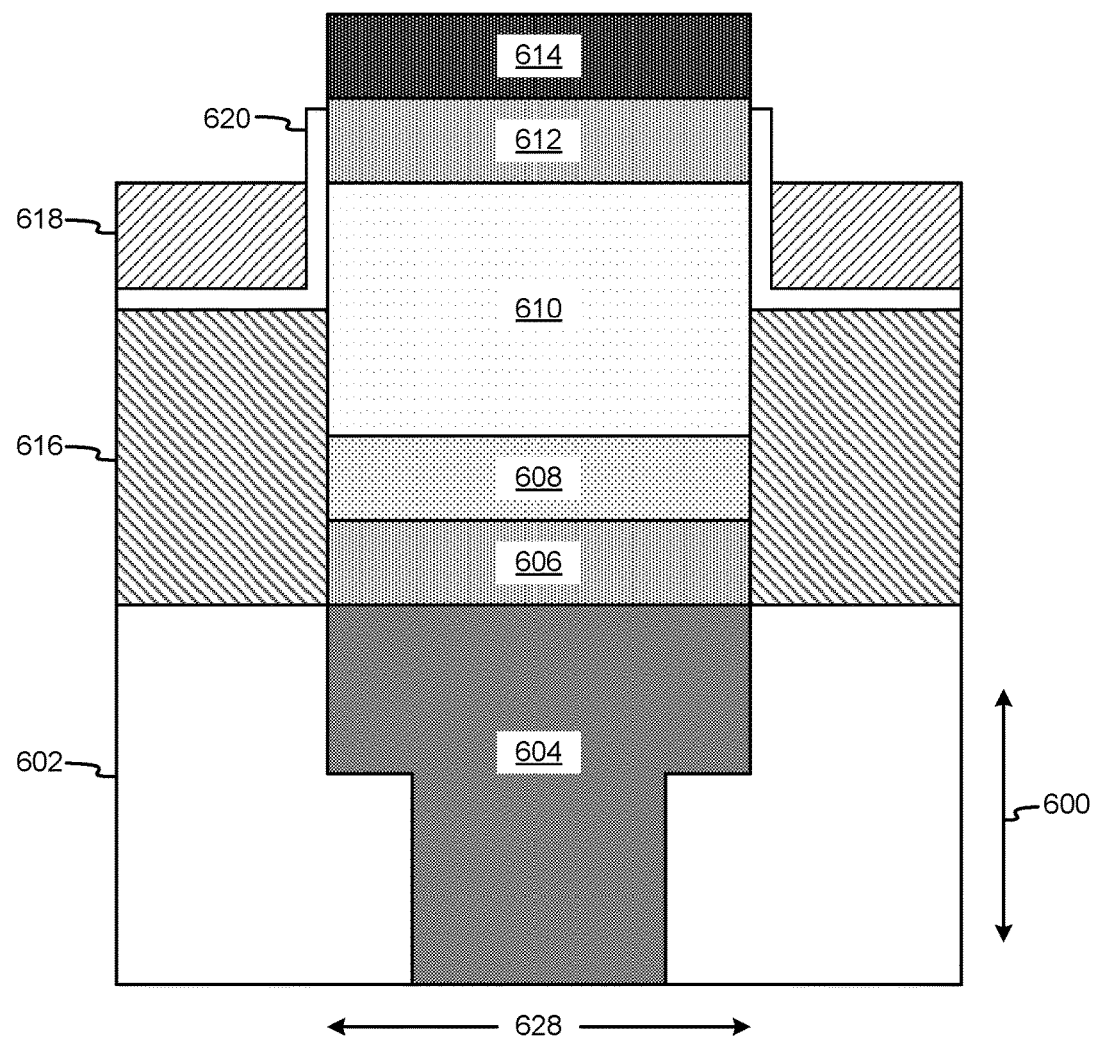

Then, as shown in FIG. 6E, a gate dielectric layer 620 is formed above the insulation layer 616 and along sides of an exposed portion of the i-channel layer 610 and sides of the drain layer 612 just below an upper extent of the drain layer 612 in the film thickness direction 600. The gate dielectric layer 620 that is formed along the sides of the pillar above the insulation layer 616 is formed to a height that does not exceed the upper extent of the drain layer 612 in the film thickness direction 600.

Thereafter, the gate layer 618 is formed on sides of the i-channel layer 610 along a plane in the element width direction 628 perpendicular to the film thickness direction 600. The gate layer 618 is formed in a position closer to the drain layer 612 than the source layer 608, and is formed above the gate dielectric layer 620 to have a thickness that does not exceed the lower extent of the drain layer 612 in the film thickness direction 600. The gate layer 618 may be formed full film, then planarized and/or recess etched (using the hardmask 614 as a pattern) to the desired maximum height level.

The skewed gate location is useful for enabling impact ionization in the i-channel layer 610 by allowing an inversion layer to be subsequently formed only in the channel area along the film thickness direction 600 where the gate layer 618 is formed around the i-channel layer 610. Fabrication is made easier, in comparison with conventional structures, by using situ-doping polysilicon deposition for the drain layer 612 n+, i-channel layer 610, and source layer 608 p+. Exact positioning of the gate layer 618 is also made possible by controlling the thickness of the interlayer dielectric insulation layer 616.

Figure 6F:
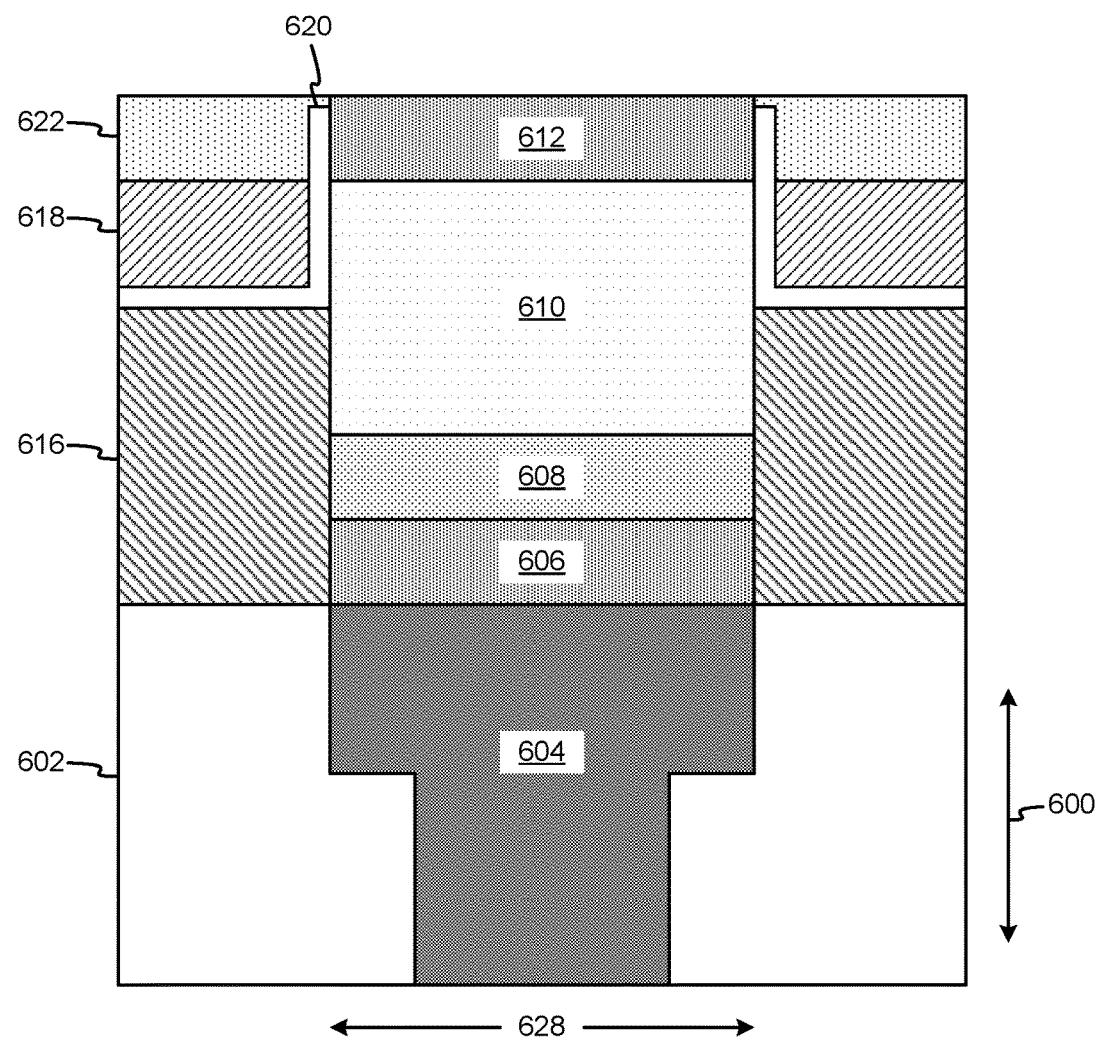

As shown in FIG. 6F, the hardmask 614 is removed, and a second insulation layer 622 is formed along sides of the drain layer 612 and the gate dielectric layer 620, then planarized and/or recess etched to a desired height.

Figure 6G:
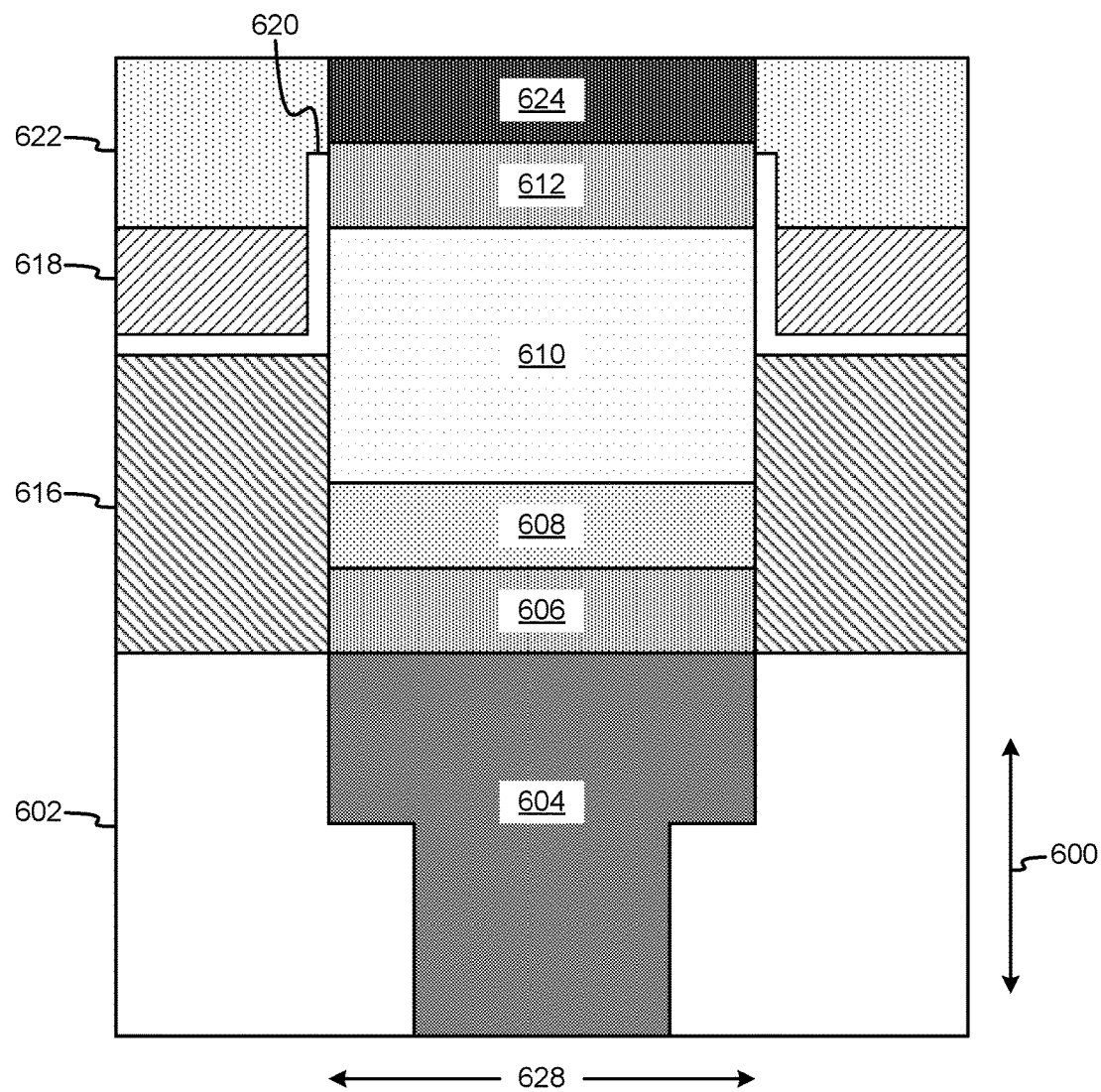

In FIG. 6G, the upper electrode layer 624 is formed above the drain layer 612, and the second insulation layer 622 is added to reach a height of the upper extent of the upper electrode layer 624. The upper electrode layer 624 may be formed, then patterned, prior to addition to the second insulation layer 622 full film, followed by planarization (such as CMP) down to the level of the upper electrode layer 624.

Figure 6H:
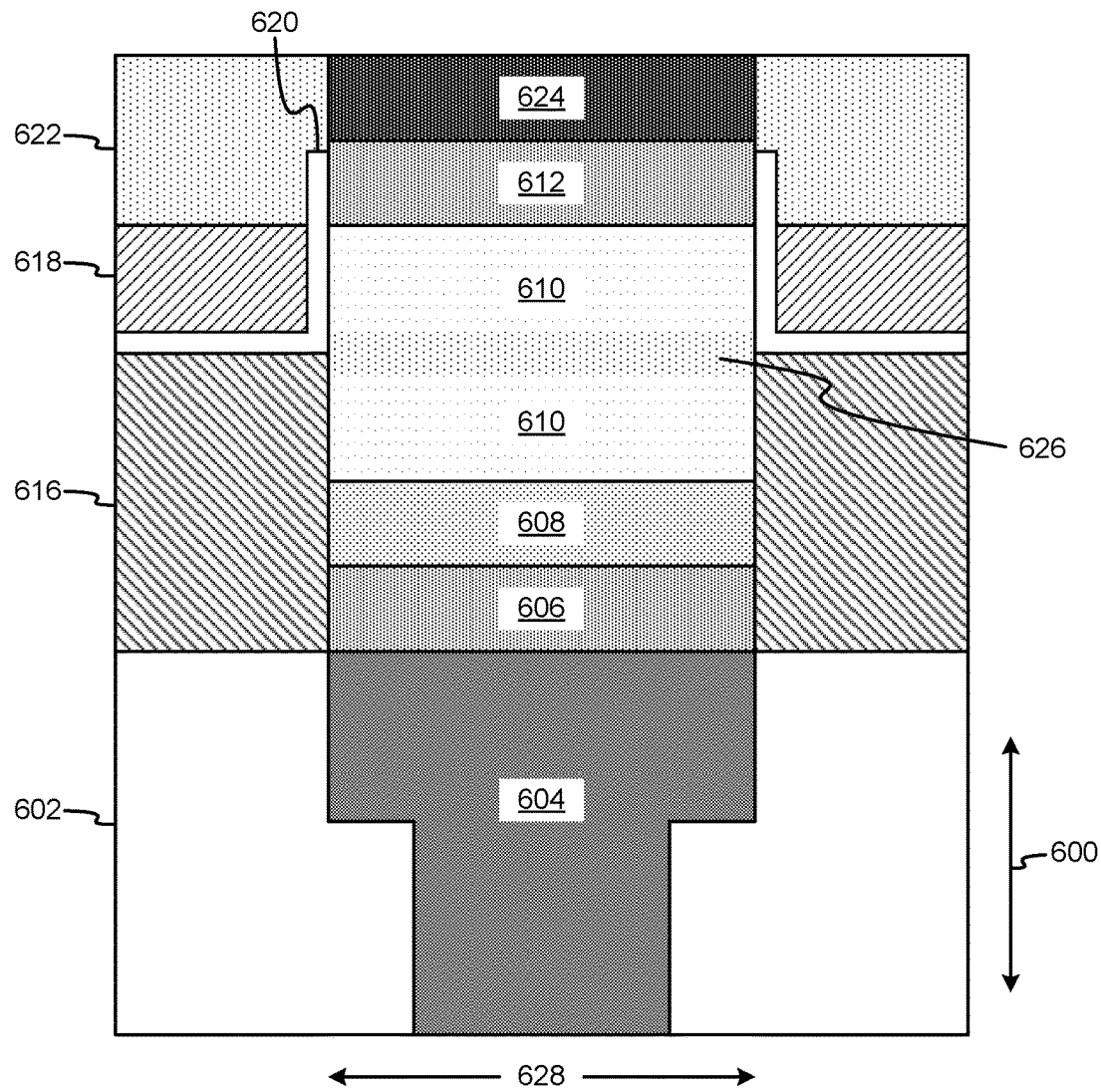

With reference to FIG. 6H, according to one embodiment, a portion of the i-channel layer 610 between the gate layer 618 positioned on sides of the i-channel layer 610 along a plane perpendicular to the film thickness direction 600 in the element width direction 628 may be delta-doped using any technique known in the art. This portion is referred to as an inversion layer 626, and is positioned closer to the source layer 608 than the drain layer 612 to provide a highly doped region over a specified distance that is useful for reducing horizontal electrical field generation, thereby mitigating unnecessary hot electron injection into the gate dielectric layer 620. In one embodiment, the i-channel layer 610 may be doped with P to create an n-type Si. In another embodiment, the i-channel layer 610 may be doped with B to create a p-type Si.

Figure 7:
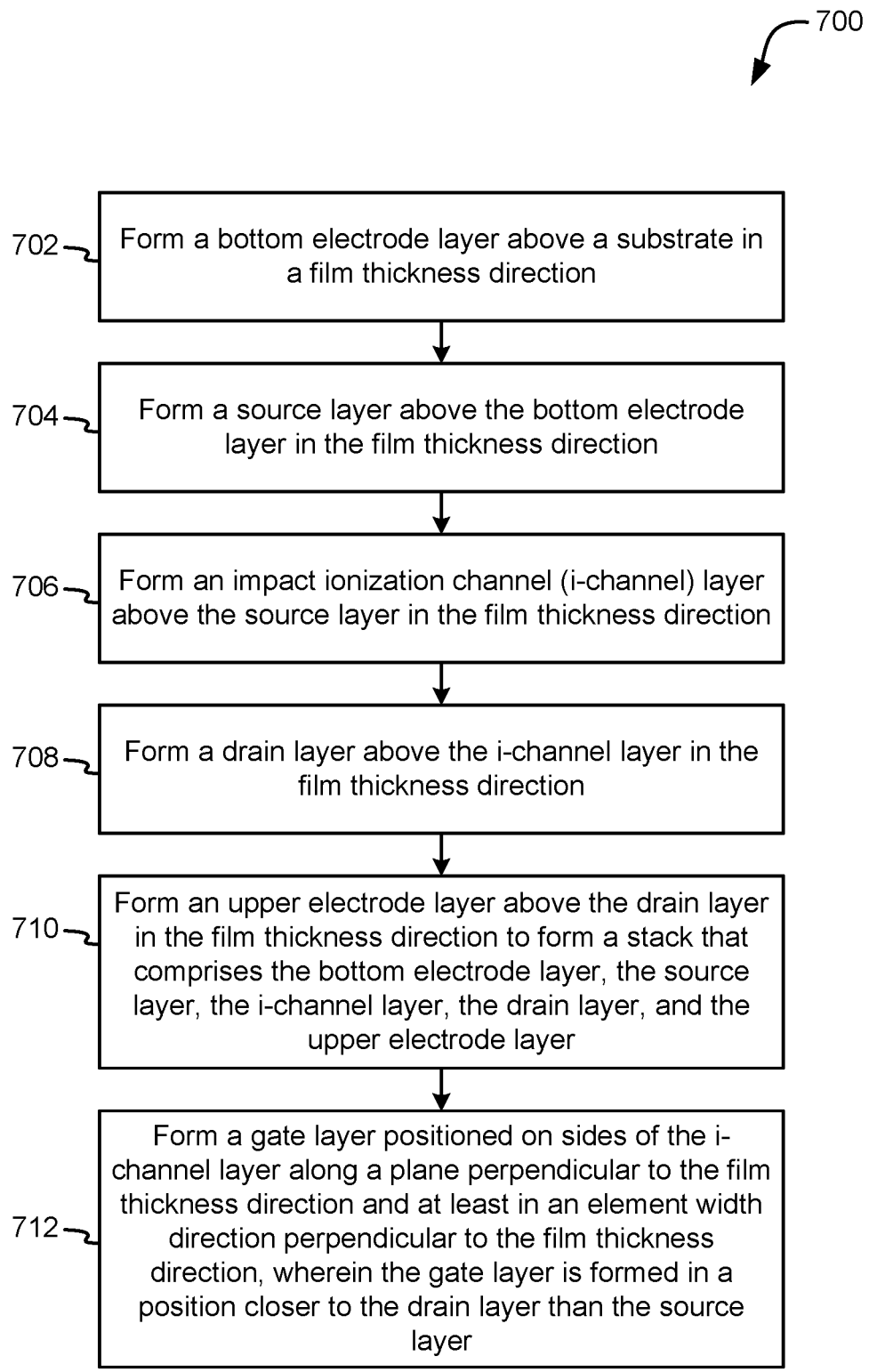
FIG. 7 is a flowchart of a method, in accordance with one embodiment.

Now referring to FIG. 7, a method 700 for forming an I-MOS is shown according to one embodiment. The method 700 may be performed in accordance with the present invention in any of the environments depicted in FIGS. 1-6H, among others not specifically described, in various approaches. Of course, more or less operations than those specifically described in FIG. 7 may be included in method 700, as would be understood by one of skill in the art upon reading the present descriptions.

Each of the operations of method 700 may be performed by any suitable component of the operating environment. For example, in various embodiments, the method 700 may be partially or entirely performed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to perform one or more operations of the method 700. Illustrative processing circuits include, but are not limited to, a CPU, an ASIC, a FPGA, etc., combinations thereof, or any other suitable computing device known in the art.

In the descriptions of method 700 in FIG. 7, each layer may be formed using any known deposition process, such as sputtering, plating, CVD, pCVD, PVD, MBE, ALD, etc. Moreover, any descriptions of removal of layers and/or material may be performed using any material removal process of a type known in the art, such as planarization, CMP, recess etching, RIE, ion milling, plasma etching, photolithography, etc.

Method 700 may begin with operation 702. In operation 702, a bottom electrode layer is formed above a substrate in a film thickness direction. In operation 704, a source layer is formed above the bottom electrode layer in the film thickness direction. In operation 706, an i-channel layer is formed above the source layer in the film thickness direction. In operation 708, a drain layer is formed above the i-channel layer in the film thickness direction.

Moreover, in operation 710, an upper electrode layer is formed above the drain layer in the film thickness direction to form a stack. The stack includes the bottom electrode layer, the source layer, the i-channel layer, the drain layer, and the upper electrode layer. Then, in operation 712, a gate layer is formed that is positioned on sides of the i-channel layer along a plane perpendicular to the film thickness direction in an element width direction. The gate layer is formed in a position closer to the drain layer than the source layer to provide asymmetric or skewed positioning that is useful for enabling planar impact ionization.

According to one embodiment, method 700 may include forming an electrically conductive channel through the substrate in the film thickness direction that is configured to electrically couple to the bottom electrode layer. In this way, the structure may be formed above another electrical structure for coupling in series.

In another embodiment, method 700 may include patterning the stack into a pillar via a material removal process, forming an insulation layer around the pillar to a level of the i-channel layer in the film thickness direction consistent with a desired lower extent of the gate layer, and forming a gate dielectric layer above the insulation layer and along sides of an exposed portion of the i-channel layer and sides of the drain layer just below an upper extent of the drain layer in the film thickness direction. The gate layer is formed above the gate dielectric layer and has a thickness that does not exceed a lower extent of the drain layer in the film thickness direction.

In several embodiments, each of the layers may include any suitable material known in the art. For example, the bottom electrode layer may include TaN, TiNi, TiN, TiW, etc., the source layer may include Si doped with B, the i-channel layer may include undoped Si, Ge, and/or SiGe, the drain layer may include Si doped with P, Si doped with Ar, Si doped with Be, Si doped with Mg, Si doped with Ca, Si doped with Sr, Si doped with Ba, Si doped with Ra, etc., the upper electrode layer may include TaN, TiNi, TiN, TiW, etc., and the gate layer may include doped polysilicon, W, TaN, TiNi, and TiN, etc.

Moreover, in one approach, method 700 may include delta-doping a portion of the i-channel layer between the gate layer positioned on sides of the i-channel layer along a plane perpendicular to the film thickness direction in the element width direction to form an inverse layer, the inverse layer of the i-channel layer being positioned closer to the source layer than the drain layer. This also enhances the impact ionization of the resulting structure.

Figure 8:
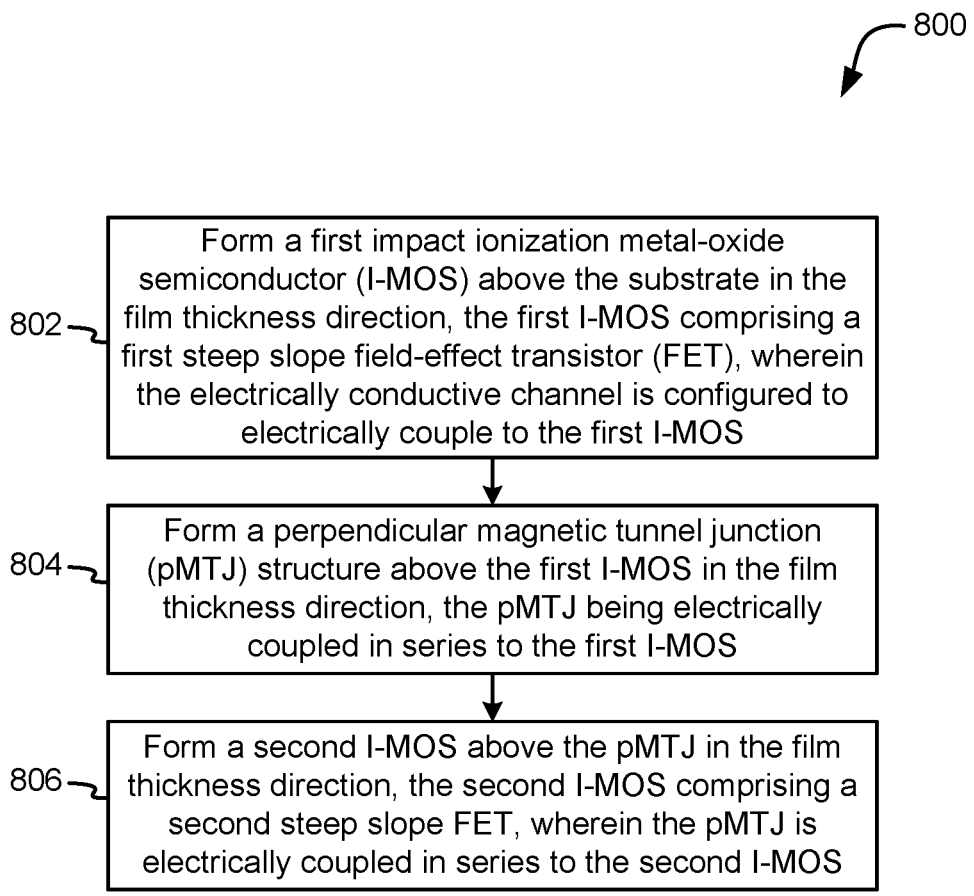
FIG. 8 shows a flowchart of another method, in accordance with one embodiment.

Now referring to FIG. 8, a method 800 for forming an I-MOS is shown according to one embodiment. The method 800 may be performed in accordance with the present invention in any of the environments depicted in FIGS. 1-6H, among others not specifically described, in various approaches. Of course, more or less operations than those specifically described in FIG. 8 may be included in method 800, as would be understood by one of skill in the art upon reading the present descriptions.

Each of the operations of method 800 may be performed by any suitable component of the operating environment. For example, in various embodiments, the method 800 may be partially or entirely performed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to perform one or more operations of the method 800. Illustrative processing circuits include, but are not limited to, a CPU, an ASIC, a FPGA, etc., combinations thereof, or any other suitable computing device known in the art.

In the descriptions of method 800 in FIG. 8, each layer may be formed using any known deposition process, such as sputtering, plating, CVD, pCVD, PVD, MBE, ALD, etc. Moreover, any descriptions of removal of layers and/or material may be performed using any material removal process of a type known in the art, such as planarization, CMP, recess etching, RIE, ion milling, plasma etching, photolithography, etc.

Method 800 may begin with operation 802. In operation 802, a first impact ionization metal-oxide semiconductor (I-MOS) is formed above a substrate in the film thickness direction. The first I-MOS includes a first steep slope FET, with the electrically conductive channel being configured to electrically couple to the first I-MOS. The first I-MOS may be formed in accordance with any known formation technique, such as that described in relation to FIG. 7, in one embodiment.

Referring again to FIG. 8, in operation 804, a pMTJ structure is formed above the first I-MOS in the film thickness direction, the pMTJ being electrically coupled in series to the first I-MOS. The pMTJ structure may be formed in accordance with any known formation technique, such as that described in relation to FIG. 5, in one embodiment.

Referring again to FIG. 8, a second I-MOS is formed above the pMTJ in the film thickness direction. The second I-MOS includes a second steep slope FET, with the pMTJ being electrically coupled in series to the second I-MOS. The second I-MOS may be formed in accordance with any known formation technique, such as that described in relation to FIG. 7 including a permutation thereof that accounts for reversal of the layer stack, in one embodiment.

Referring again to FIG. 8, in one embodiment, method 800 may include forming the substrate. In a further approach, method 800 may include forming an electrically conductive channel through the substrate in the film thickness direction, the electrically conductive channel being formed by doping the substrate material with one or more elements that cause the doped portion of the substrate to be electrically conductive, or by removing a channel and backfilling with a conductive material known in the art.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. An apparatus, comprising:
a bottom electrode layer positioned above a substrate in a film thickness direction;
a source layer positioned above the bottom electrode layer in the film thickness direction;
an impact ionization channel (i-channel) layer positioned above the source layer in the film thickness direction;
a drain layer positioned above the i-channel layer in the film thickness direction;
an upper electrode layer positioned above the drain layer in the film thickness direction that forms a stack that comprises the bottom electrode layer, the source layer, the i-channel layer, the drain layer, and the upper electrode layer; and
a gate layer positioned on sides of the i-channel layer along a plane perpendicular to the film thickness direction in an element width direction,
wherein the gate layer is positioned closer to the drain layer than the source layer;
wherein the gate layer is positioned above a gate dielectric layer and has a thickness that does not exceed a lower extent of the drain layer in the film thickness direction.

2. The apparatus as recited in claim 1, further comprising:
an electrically conductive channel that is positioned within a portion of the substrate, the electrically conductive channel being electrically coupled to the bottom electrode layer.

3. The apparatus as recited in claim 1,
wherein the bottom electrode layer comprises at least one material selected from a group consisting of: TaN, TiNi, TiN, and TiW,
wherein the source layer comprises Si doped with B,
wherein the i-channel layer comprises at least one material selected from a group consisting of: undoped Si, Ge, and SiGe,
wherein the drain layer comprises at least one material selected from a group consisting of: Si doped with P, Si doped with Ar, Si doped with Be, Si doped with Mg, Si doped with Ca, Si doped with Sr, Si doped with Ba, and Si doped with Ra,
wherein the upper electrode layer comprises at least one material selected from a group consisting of: TaN, TiNi, TiN, and TiW, and
wherein the gate layer comprises at least one material selected from a group consisting of: doped polysilicon, W, TaN, TiNi, and TiN.

4. The apparatus as recited in claim 1, wherein a portion of the i-channel layer positioned between the gate layer along the plane perpendicular to the film thickness direction in the element width direction is delta-doped, the delta-doped portion of the i-channel layer being positioned closer to the source layer than the drain layer.

5. An apparatus, comprising:
a first bottom electrode layer positioned above a substrate in a film thickness direction;
a first source layer positioned above the first bottom electrode layer in the film thickness direction;
a first impact ionization channel (i-channel) layer positioned above the first source layer in the film thickness direction;
a first drain layer positioned above the first i-channel layer in the film thickness direction;
a first upper electrode layer positioned above the first drain layer in the film thickness direction that forms a first stack that comprises the first bottom electrode layer, the first source layer, the first i-channel layer, the first drain layer, and the first upper electrode layer;
a first gate layer positioned on sides of the first i-channel layer along a plane perpendicular to the film thickness direction in an element width direction, wherein the first gate layer is positioned closer to the first drain layer than the first source layer;
a perpendicular magnetic tunnel junction (pMTJ) structure positioned above the first upper electrode layer that is electrically coupled to the first upper electrode layer;
a second bottom electrode layer positioned above the pMTJ in the film thickness direction that is electrically coupled to the pMTJ;
a second drain layer positioned above the second bottom electrode layer in the film thickness direction, the second drain layer being electrically coupled to the pMTJ;
a second i-channel layer positioned above the second drain layer in the film thickness direction;
a second source layer positioned above the second i-channel layer in the film thickness direction;
a second upper electrode layer positioned above the second source layer in the film thickness direction that forms a second stack that comprises the second bottom electrode layer, the second drain layer, the second i-channel layer, the second source layer, and the second upper electrode layer; and
a second gate layer positioned on sides of the second i-channel layer along the plane perpendicular to the film thickness direction in the element width direction, wherein the second gate layer is positioned closer to the second drain layer than the second source layer.

6. The apparatus as recited in claim 5, further comprising a first electrically conductive channel that is positioned within a portion of the substrate, the first electrically conductive channel being electrically coupled to the first bottom electrode layer.

7. The apparatus as recited in claim 5, wherein the first gate layer is positioned above a first gate dielectric layer and has a thickness that does not exceed a lower extent of the first drain layer in the film thickness direction.

8. The apparatus as recited in claim 7, wherein the second gate layer is positioned above a second gate dielectric layer and has a thickness that does not exceed a midpoint of the second i-channel in the film thickness direction.

9. The apparatus as recited in claim 5,
wherein the first bottom electrode layer and the second bottom electrode layer each comprises at least one material selected from a group consisting of: TaN, TiNi, TiN, and TiW,
wherein the first source layer and the second source layer each comprises Si doped with B,
wherein the first i-channel layer and the second i-channel layer each comprises at least one material selected from a group consisting of: undoped Si, Ge, and SiGe,
wherein the first drain layer and the second drain layer each comprises at least one material selected from a group consisting of: Si doped with P, Si doped with Ar, Si doped with Be, Si doped with Mg, Si doped with Ca, Si doped with Sr, Si doped with Ba, and Si doped with Ra,
wherein the first upper electrode layer and the second upper electrode layer each comprises at least one material selected from a group consisting of: TaN, TiNi, TiN, and TiW, and
wherein the first gate layer and the second gate layer each comprises at least one material selected from a group consisting of: doped polysilicon, W, TaN, TiNi, and TiN.

10. The apparatus as recited in claim 5,
wherein a portion of the first i-channel layer positioned between the first gate layer along the plane perpendicular to the film thickness direction in the element width direction is delta-doped, the delta-doped portion of the first i-channel layer being positioned closer to the first source layer than the first drain layer, and
wherein a portion of the second i-channel layer positioned between the second gate layer along the plane perpendicular to the film thickness direction in the element width direction is delta-doped, the delta-doped portion of the second i-channel layer being positioned closer to the second source layer than the second drain layer.

11. An apparatus, comprising:
a substrate;
an electrically conductive channel positioned within a portion of the substrate;
a first impact ionization metal-oxide semiconductor (I-MOS) positioned above the substrate in a film thickness direction, the first I-MOS comprising a first steep slope field-effect transistor (FET), wherein the electrically conductive channel is electrically coupled to the first I-MOS;
a perpendicular magnetic tunnel junction (pMTJ) structure positioned above the first I-MOS in the film thickness direction, the pMTJ being electrically coupled in series to the first I-MOS; and
a second I-MOS positioned above the pMTJ in the film thickness direction, the second I-MOS comprising a second steep slope FET, wherein the pMTJ is electrically coupled in series to the second I-MOS.

12. The apparatus as recited in claim 11, wherein the first I-MOS comprises:
a first bottom electrode layer positioned above the substrate in the film thickness direction;
a first source layer positioned above the first bottom electrode layer in the film thickness direction;
a first impact ionization channel (i-channel) layer positioned above the first source layer in the film thickness direction;
a first drain layer positioned above the first i-channel layer in the film thickness direction;
a first upper electrode layer positioned above the first drain layer in the film thickness direction that forms a first stack that comprises the first bottom electrode layer, the first source layer, the first i-channel layer, the first drain layer, and the first upper electrode layer; and
a first gate layer positioned on sides of the first i-channel layer along a plane perpendicular to the film thickness direction in an element width direction, wherein the first gate layer is positioned closer to the first drain layer than the first source layer.

13. The apparatus as recited in claim 12, wherein the first gate layer is positioned above a first gate dielectric layer and has a thickness that does not exceed a lower extent of the first drain layer in the film thickness direction.

14. The apparatus as recited in claim 12,
wherein the first bottom electrode layer comprises at least one material selected from a group consisting of: TaN, TiNi, TiN, and TiW,
wherein the first source layer comprises Si doped with B,
wherein the first i-channel layer comprises at least one material selected from a group consisting of: undoped Si, Ge, and SiGe,
wherein the first drain layer comprises at least one material selected from a group consisting of: Si doped with P, Si doped with Ar, Si doped with Be, Si doped with Mg, Si doped with Ca, Si doped with Sr, Si doped with Ba, and Si doped with Ra,
wherein the first upper electrode layer comprises at least one material selected from a group consisting of: TaN, TiNi, TiN, and TiW, and
wherein the first gate layer comprises at least one material selected from a group consisting of: doped polysilicon, W, TaN, TiNi, and TiN.

15. The apparatus as recited in claim 12, wherein a portion of the first i-channel layer positioned between the first gate layer along the plane perpendicular to the film thickness direction in the element width direction is delta-doped, the delta-doped portion of the first i-channel layer being positioned closer to the first source layer than the first drain layer.

16. The apparatus as recited in claim 11, wherein the second I-MOS comprises:
a second bottom electrode layer positioned above the pMTJ in the film thickness direction that is electrically coupled to the pMTJ;
a second drain layer positioned above the second bottom electrode layer in the film thickness direction, the second drain layer being electrically coupled to the pMTJ;
a second i-channel layer positioned above the second drain layer in the film thickness direction;
a second source layer positioned above the second i-channel layer in the film thickness direction;
a second upper electrode layer positioned above the second source layer in the film thickness direction that forms a second stack that comprises the second bottom electrode layer, the second drain layer, the second i-channel layer, the second source layer, and the second upper electrode layer; and
a second gate layer positioned on sides of the second i-channel layer along a plane perpendicular to the film thickness direction in an element width direction, wherein the second gate layer is positioned closer to the second drain layer than the second source layer.

17. The apparatus as recited in claim 16, wherein the second gate layer is positioned above a second gate dielectric layer and has a thickness that does not exceed a midpoint of the second i-channel in the film thickness direction.

18. The apparatus as recited in claim 16,
wherein the second bottom electrode layer comprises at least one material selected from a group consisting of: TaN, TiNi, TiN, and TiW,
wherein the second source layer comprises Si doped with B,
wherein the second i-channel layer comprises at least one material selected from a group consisting of: undoped Si, Ge, and SiGe,
wherein the second drain layer comprises at least one material selected from a group consisting of: Si doped with P, Si doped with Ar, Si doped with Be, Si doped with Mg, Si doped with Ca, Si doped with Sr, Si doped with Ba, and Si doped with Ra,
wherein the second upper electrode layer comprises at least one material selected from a group consisting of: TaN, TiNi, TiN, and TiW, and
wherein the second gate layer comprises at least one material selected from a group consisting of: doped polysilicon, W, TaN, TiNi, and TiN.

19. The apparatus as recited in claim 16, wherein a portion of the second i-channel layer positioned between the second gate layer along the plane perpendicular to the film thickness direction in the element width direction is delta-doped, the delta-doped portion of the second i-channel layer being positioned closer to the second source layer than the second drain layer.

* * * * *